United States Patent
Vaney et al.

(10) Patent No.: US 11,089,718 B2
(45) Date of Patent: Aug. 10, 2021

(54) DATA CENTRE COOLING SYSTEMS

(71) Applicant: BRIPCO BVBA

(72) Inventors: Nick Vaney, Witney Oxon (GB); Tom Kingham, Oxford (GB); Simon Britton, Oxford (GB)

(73) Assignee: BRIPCO BVBA, Antwerp (BE)

( * ) Notice: Subject to any disclaimer, the term of this patent is extended or adjusted under 35 U.S.C. 154(b) by 0 days.

(21) Appl. No.: 16/840,122

(22) Filed: Apr. 3, 2020

(65) Prior Publication Data

US 2020/0296861 A1    Sep. 17, 2020

Related U.S. Application Data

(63) Continuation of application No. 15/850,464, filed on Dec. 21, 2017, now abandoned, which is a (Continued)

(30) Foreign Application Priority Data

May 26, 2010 (GB) ..................... 1008825
Aug. 11, 2010 (GB) ..................... 1013506

(51) Int. Cl.
*H05K 7/20* (2006.01)

(52) U.S. Cl.
CPC ..... *H05K 7/20745* (2013.01); *H05K 7/20836* (2013.01)

(58) Field of Classification Search
CPC . H05K 7/20836; H05K 7/20745; F24F 13/08; F24F 13/10; F25B 2600/112;
(Continued)

(56) References Cited

U.S. PATENT DOCUMENTS 4,103,508 A    8/1978  Apple
4,118,945 A    10/1978 Boochever et al.
(Continued)

FOREIGN PATENT DOCUMENTS

DE    3823653 C1    2/1990
DE    20220834 U1   4/2004
(Continued)

OTHER PUBLICATIONS

Examination Report, application No. 11724011.9, dated Jul. 11, 2019.
(Continued)

*Primary Examiner* — Jianying C Atkisson
*Assistant Examiner* — Meraj A Shaikh
(74) *Attorney, Agent, or Firm* — Carlos A. Fisher; Stout, Uxa & Buyan, LLP

(57) ABSTRACT

A method of cooling a data centre having at least one hot aisle (145) and at least one cold aisle (144), including the steps of producing cooling air having controlled to have temperature and relative humidity within certain pre-defined limits; supplying the cooling air to a plurality of items of IT equipment (143) located in the data centre between the cold aisle and the hot aisle; measuring the velocity of air flowing from the hot aisle to the cold aisle through an opening (150) between the hot aisle and the cold aisle; and controlling the rate of supply of cooling air to the items of IT equipment in dependence on the velocity of air so measured.

20 Claims, 9 Drawing Sheets

Related U.S. Application Data continuation of application No. 13/699,350, filed as application No. PCT/GB2011/050987 on May 25, 2011, now Pat. No. 9,930,812.

(60) Provisional application No. 61/410,762, filed on Nov. 5, 2010.

(58) Field of Classification Search
CPC .......... F25B 2600/23; F25B 2600/0253; F25B 2600/0251; F25B 2700/21174; F25B 2700/21175; F25B 2700/21173
See application file for complete search history.

(56) References Cited

U.S. PATENT DOCUMENTS

| | | | |
|---|---|---|---|
| 4,379,484 A | | 4/1983 | Lom et al. |
| 4,446,703 A | | 5/1984 | Gilbertson |
| 4,478,767 A | | 10/1984 | Watanabe et al. |
| 4,494,596 A | | 1/1985 | Bradshaw |
| 5,197,293 A | | 3/1993 | Okamura et al. |
| 5,545,086 A | | 8/1996 | Sharp et al. |
| 5,620,503 A | * | 4/1997 | Miller .................. F24F 6/14 95/211 |
| 6,079,483 A | | 6/2000 | Morooka et al. |
| 6,467,694 B1 | | 10/2002 | Jerome |
| 6,623,545 B2 | | 9/2003 | Thordarson et al. |
| 6,676,026 B1 | | 1/2004 | McKinley et al. |
| 6,681,584 B1 | | 1/2004 | Conner |
| 6,694,759 B1 | | 2/2004 | Bash et al. |
| 7,330,350 B2 | | 2/2008 | Hellrigel et al. |
| 7,716,939 B1 | | 5/2010 | Morales |
| 2001/0035462 A1 | | 11/2001 | Collazo |
| 2003/0050003 A1 | | 3/2003 | Charron |
| 2004/0068994 A1 | | 4/2004 | Yoon et al. |
| 2004/0149832 A1 | | 8/2004 | Peterson |
| 2006/0091229 A1 | * | 5/2006 | Bash .................. F24F 11/70 236/49.3 |
| 2007/0069850 A1 | | 3/2007 | Anderson, Jr. et al. |
| 2008/0029250 A1 | | 2/2008 | Carlson et al. |
| 2008/0185446 A1 | | 8/2008 | Tozer |
| 2008/0291626 A1 | | 11/2008 | Nelson et al. |
| 2009/0088873 A1 | | 4/2009 | Avery et al. |
| 2009/0107652 A1 | * | 4/2009 | VanGilder .......... H05K 7/20745 165/80.2 |
| 2009/0210096 A1 | * | 8/2009 | Stack .................. F24F 11/30 700/278 |
| 2009/0326721 A1 | | 12/2009 | Kentaroh |
| 2010/0027216 A1 | | 2/2010 | Matushima |
| 2010/0048119 A1 | | 2/2010 | Kanji |
| 2010/0076607 A1 | * | 3/2010 | Ahmed .................. G06F 1/206 700/276 |
| 2010/0091448 A1 | | 4/2010 | Noteboom et al. |
| 2010/0136895 A1 | | 6/2010 | Sgro |
| 2010/0154448 A1 | * | 6/2010 | Hay .................. G06F 1/20 62/175 |
| 2013/0176675 A1 | | 7/2013 | Hundertmark |

FOREIGN PATENT DOCUMENTS

| | | |
|---|---|---|
| DE | 202004003309 U1 | 9/2004 |
| DE | 102009011007 A1 | 9/2010 |
| GB | 2446454 A1 | 8/2008 |
| GB | 2460231 A | 12/2008 |
| GB | 2454284 A | 4/2010 |
| GB | 2465509 A | 5/2010 |
| WO | 973154 A1 | 9/1997 |
| WO | 2007019304 A2 | 2/2007 |
| WO | 2007055838 A2 | 5/2007 |
| WO | 2007139559 A1 | 12/2007 |
| WO | 2008127344 A1 | 10/2008 |
| WO | 2009059796 A1 | 5/2009 |
| WO | WO2010017429 A1 | 2/2010 |
| WO | 2010039120 A1 | 4/2010 |
| WO | 2011148175 A1 | 4/2010 |
| WO | 2010054786 A1 | 5/2010 |
| WO | 2010065903 | 6/2010 |
| WO | WO2010063559 A1 | 6/2010 |
| WO | 2010075358 A1 | 7/2010 |
| WO | 2010131954 A1 | 11/2010 |
| WO | 2011051665 A2 | 5/2011 |
| WO | WO2011066311 A1 | 6/2011 |
| WO | WO2011142354 A1 | 11/2011 |

OTHER PUBLICATIONS

Hernandez et al. "Analysis of Hybrid Cooling System and ACT Pilot Demonstration Site" Jan. 18, 1996.
Greenburg et al. "Best Practices for Data Centers: Lessons Learned from Benchmarking 22 Data Centers" Jan. 1, 2006.
"Ducted Exhaust Cabintet Maging Exhaust Airflow Bewong Aisle/Cold Aisle", Chatsworth Products Inc. Jan. 1, 2006.
"High Performance Data Centers: A Design Guidelines Sourcebook, Pacific Gas and Electric Company" Jan. 1, 2006.
"Fresh Air Cooling in Data Centres Overview of approch showing potential savings in operational costs", Data Center Dymanics, Jul. 2, 2007.
"Adding mechanical cooling to indirect/direct evaporative systems". Johnson Barrow Inc. Jan. 12, 2007.
2008 ASHRAE Environments Guidelines for Datacom Equipment; ASHRAE. Jan. 1, 2008.
"Global Data Centre Energy Strategy" Tozer, Jan. 12, 2009.
"SGI tries adiabatic cooling to make a data centre container greener,", SGI (Focus Magazine), May 25, 2010.
UKIPO Search Report, Application No. GB1008825.0, dated Aug. 31, 2010.
UKIPO Search Report (further), Application No. GB1008825.0, dated Dec. 16, 2010.
EPO International Search Report Application No. PCT/GB2011/050987, dated Nov. 27, 2012.
International Search Report for PCT/GB2011/050987.
Extended European Search Report of EP Patent Application 20196535.7-1004, dated Dec. 7, 2020.

* cited by examiner

DATA CENTRE COOLING SYSTEMS

BACKGROUND OF THE INVENTION

The present invention concerns data centres and a method of cooling equipment in a data centre. The invention also concerns apparatus for cooling a data centre.

A data centre is a late 20$^{th}$ Century development that has grown as a response to the increasing demand for computer processing capability and a recognition of the importance of information technology (IT) in the place of every business and organisation today. Whereas smaller organisations have sufficient processing power with laptops, PCs and occasionally servers, larger organisations require higher capacity centralised processing to serve a wide range of needs and applications. A few years ago this capacity was supplied by large mainframe computers, but more recently the method used has been to provide data centres comprising many networked computer servers known as "blades" installed in racks enabling controlled and modular expansion of capacity. The racks also typically house storage systems and/or telecommunications equipment such as routers to handle data flow between the computer servers and data flow between the data centre and the outside world.

One key problem faced is how to cool a data centre effectively and efficiently. In a traditional data centre arrangement the racks are laid out in rows. Cooling is provided by direct expansion (Dx) or chilled water cooling plants. The cool air produced by these units is entrained through an underfloor plenum and exits through floor grilles at the front of the IT rack rows. The IT products installed in the racks contain integral fans which draw the cooled air from the front across the circuitry and heat is exhausted via vents in the products to the rear. In certain arrangements of the prior art, the separation between these IT racks creates a 'hot aisle' into which air is expelled by the IT products in the racks and a 'cold aisle' from which cooler air is drawn into and through the IT products by their integral fans.

A typical arrangement of the prior art is shown schematically in FIG. 1 of the attached drawings. Thus, the data centre includes a rack room 1 defined by walls 2 in which two sets of racks 4 for IT equipment are accommodated. The IT equipment in the racks 4 generate heat, represented by arrows 6. The cooling of the IT equipment is achieved by introducing cold air, via a floor void, into the room by means of air conditioning units, the cold air being represented by arrows 8.

In certain data centre arrangements it is important that the volume of cold air supplied is equal to or greater than that drawn through the servers by their internal fans. If the volume is not sufficient, then the servers can draw in warm air from other areas of the data centre, possibly resulting in the IT equipment overheating. In a traditional data centre this is generally avoided by supplying significantly more cold air than the servers actually need at any given time. It will be seen that this typical data centre arrangement is not particularly energy efficient.

The drive for more efficient use of power has given rise to a need to make the cooling regimes used in data centres more efficient, as cooling of equipment typically contributes significantly to the power used by a data centre. For example, the power usage in certain data centres may require between 1 kW and 2 kW of power for every 1 kW of power used to power the IT equipment, a significant proportion of which would be related to cooling.

In recent years, data centre designers have sought to improve energy efficiency with cooling systems that attempt to tailor the amount of cooling air delivered to the actual requirements of the servers at any given time. U.S. Pat. No. 6,283,380 (IBM), for example, describes a system for automatically controlling the volume and distribution of cooling air supplied to IT equipment in a data centre based on the data provided by a network of temperature sensors deployed at various positions around the rack room. The temperature data is input into a computer simulation of the rack room and the predictions of this simulation are used to adjust the speed of the fans supplying the cooling air. This system has the disadvantages that it requires a significant number of both fans and temperature sensors to be distributed around the data centre in order to achieve effective airflow control, and the simulation uses significant computing power.

An alternative method is to measure the pressure in the "cold aisle" area at the front of the racks and to adjust the amount of cold air supplied from the CRAC unit so as to maintain a constant pressure. The pressure at the front of the racks will vary according to whether the amount of cold air being supplied is too much or too little to meet the demand of the servers. If too much cold air is supplied, the pressure will increase, whereas if too little is supplied it will decrease. Keeping the pressure constant therefore means that the amount of cold air supplied by the CRAC unit is appropriate to the demand of the servers at a given time.

U.S. Pat. No. 6,694,759 (Hewlett Packard) provides an example of this method in which pressure measurements are also used to adjust the vents through which the cold air exits a cold air plenum, providing an extra level of control over the airflow. As this document explains, however, the pressure within the rack room and within the plenum is highly non-uniform, and fluctuates unpredictably. As such, a complex network of sensors and vents is required in order to provide adequate airflow control.

Efforts to improve energy efficiency by separating the flows of hot and cold air in a data centre have also become popular recently. This may be done by, for example, adding baffles across the top of the hot and/or cold aisles, with doors or further panels across the end of the aisle. A baffle arrangement is for example proposed in WO 2006/124240 (APC). In data centres where the hot aisles and/or the cold aisles are enclosed, the pressure differential between the front and rear of the racks can be larger than the situation where the hot and cold aisles are not sealed off from one another. In such data centres if the pressure in the cold aisle becomes lower than the pressure in the hot aisle, warm air from the hot aisle can be drawn back through the servers since all other air paths are blocked. This situation is likely to lead to the servers overheating. In data centres with encapsulated hot and/or cold aisles, it is therefore even more important to ensure that the pressure in the cold aisle is always greater than that in the hot aisle. GB2466178 (Hewlett Packard) (filed earlier but published later than the earliest claimed priority date of the present application) describes a method of monitoring this pressure differential in a data centre where the cold aisles are supplied with cooling air from an underfloor plenum, which involves measuring the air flow velocity through a small opening between a hot aisle and a neighbouring cold aisle.

A further way of improving the energy efficiency of a data centre is to use cool air from outside the data centre for cooling the IT equipment (known in the art as free cooling) whenever the ambient conditions allow, and/or using adiabatic cooling instead of mechanical cooling. WO2010/075358 (Amazon Technologies) (filed earlier but published later than the earliest claimed priority date of the present application), for example, describes a data centre cooling system having both mechanical and adiabatic cooling apparatus, which can be operated in various modes utilising combinations of adiabatic, mechanical and free cooling depending. A disadvantage of prior art combined systems such as that of WO2010/075358 is that although they control what type of cooling apparatus is used depending on ambient air conditions, they are not sophisticated enough to be able to tailor the interaction of the various types of cooling apparatus so as to achieve optimum, or close to optimum, efficiency.

The present invention seeks to provide an improved method and apparatus for cooling a data centre. Alternatively or additionally, the present invention seeks to provide a system for cooling a data centre that mitigates one or more of the above mentioned disadvantages.

SUMMARY OF THE INVENTION

The present invention relates to various aspects of a method of cooling IT equipment and/or aspects of a data centre for housing such IT equipment. The invention also relates to a control apparatus for controlling the performance of such methods. Embodiments of at least some of the aspects of the invention described below relate to data centres in which IT equipment is, or may be, arranged, for example in racks, between a cold region and a hot region. Cooling air may thus be arranged to pass from the cold region to the hot region over and/or through the IT equipment to thereby cool the IT equipment. Some aspects of the present invention relate to the way in which the cooling of the IT equipment is controlled. There are therefore several aspects of the invention which are independent from one another, but which share common features. Some aspects of the invention require the provision of a source of cooling air, for example including one or more fans. Some aspects of the invention require the provision of an adjustably sized aperture arranged to control the rate of flow of cooling air to the IT equipment. In some cases, there is provided an adiabatic cooler. In some embodiments, there is provided an air flow sensor. In some embodiments, there is provided a control system, for example a control unit, for performing control processes. In some embodiments, there are provided means for determining the psychrometric characteristics, for example the relative humidity and temperature, of air, for example air from outside the data centre. Various aspects of the invention will now be described in further detail.

The present invention provides, according to a first aspect, a method of cooling a data centre having at least one hot region and at least one cold region, wherein the method comprises the steps of:

producing cooling air, preferably controlled to have temperature and relative humidity within certain pre-defined limits;

supplying the cooling air to a plurality of items of IT equipment located between the cold region and the hot region;

measuring the rate of air flow from the cold region to the hot region through an opening between the hot region and the cold region, and controlling the rate of supply of cooling air to the items of IT equipment in dependence on the air flow rate so measured.

The rate of air flow from the cold region to the hot region may be measured by measuring the velocity of air flowing through an opening between the hot region and the cold region. There may be more than one opening between the cold region and the hot region. Where there is more than one opening, the openings need not connect the cold region to the same hot region. The openings may connect the cold region to two or more different hot regions. Where there is more than one opening, the rate of air flow from the cold region to the hot region through each opening may be measured. In such a case, the rate of supply of cooling air may be controlled in dependence on the average of the air flow rates so measured or in dependence on the highest of the air flow rates so measured, or in dependence on some other calculation using one or more of the combination of the air flow rates so measured.

The IT equipment may be arranged in racks. The hot region may be in the form of a substantially enclosed region. It may be in the form of a duct. It may be in the form of a space bound by a floor, a ceiling and one or more walls. The floor may be level with the bottom of the racks. The hot region may be in the form of an over-floor air duct. The ceiling may be level with the top of the racks. The hot region may be a hot aisle, for example a hot aisle that acts as an over-floor air duct. The cold region may have similar such characteristics as the hot region. For example, the cold region may be in the form of a substantially enclosed region. The cold region may be in the form of a duct. The cold region may be in the form of a space bound by a floor, a ceiling and one or more walls. The cold region may be in the form of an over-floor air duct. The cold region may be a cold aisle, for example a cold aisle that acts as an over-floor air duct. The step of supplying the cooling air to the plurality of items of IT equipment may be conducted by means of an over-floor air duct, for example defined in part by the cold region. The over-floor air duct supplying cooling air may extend all the way from the source of the cooling air to the plurality of items of IT equipment. The over-floor air duct may include one or more adjustably sized apertures arranged to control the rate of flow of cooling air to the IT equipment. The over-floor air duct may be in the form of a corridor, for example a personnel corridor. Thus, the cooling of the items of IT equipment may be achieved by introducing cooling air, via a route not being via a floor void, into the cold region.

The hot region may be a hot aisle, and/or the cold region may be a cold aisle. Advantageously, the step of controlling the rate of supply of cooling air in dependence on the air flow rate so measured enables arrangements in which only the amount of cooling air actually needed by the IT equipment is supplied at any given time. In an embodiment of the invention, this allows an arrangement in which the energy efficiency of the data centre may be improved by the equipment used to produce cooling air always operating at as low a level as possible. Furthermore, the cooling air requirements of each cold region are preferably determined based on a single air flow rate parameter (based on, say, measurements from one or two velocity sensors, for example). A complex network of sensors and simulations may not therefore be needed.

The method may further comprise the steps of producing cooling air at a first rate and subsequently producing cooling air at a second rate (i.e. different from the first rate). The cooling air may be produced by one or more fans including at least one variable speed fan. The method may include varying the rate at which cooling air is produced, for example varying it according to the cooling requirements of the IT equipment at any given time, which may be achieved by means of the measured rate of air flow through the opening.

The method may further comprise the step of passing cooling air through an aperture of a first effective size, adjusting the size of the aperture to a second effective size (i.e. different from the first effective size), and subsequently passing cooling air through the aperture of the second effective size. The aperture may be an adjustably sized aperture. It may include, or be defined by, a damper. The aperture may include several damper blades, in which case the area defined between a pair of blades or between a blade and the edge of the aperture may be adjustable. In such a case, the aperture may be considered as extending to cover the space defined by the blades and the area between adjacent blades. The effective size of the aperture may be adjusted by rotating the damper blade (s) along their axes. The aperture may be located upstream of the IT equipment and downstream of the apparatus used to produce the cooling air. Advantageously, the provision of an adjustably sized aperture allows a further level of control over the amount of cooling air supplied to the IT equipment.

The step of controlling the rate of supply of cooling air may include varying the size of the aperture in dependence on the air flow rate through the opening. The step of controlling the rate of supply of cooling air may also include varying the rate of production of cooling air in dependence on the size of the aperture and on the air flow rate through the opening.

The method may include the step of controlling the rate of supply of cooling air to the IT equipment in dependence on at least one criterion concerning the air flow rate through the opening. Preferably the criterion is defined such that the air pressure in the cold region will always be slightly higher than the air pressure in the hot region. Preferably the criterion is defined such that the air pressure in the cold region will never be significantly higher than necessary to generate the cooling air flows necessary to meet the cooling demand of the IT equipment. The criterion may be defined such that the air pressure in the cold region will never be considerably higher than the air pressure in the hot region. Maintaining at least some air flow from the cold region to the hot region through the opening indicates that the cold region is at an appropriate pressure to meet the cooling demand of the IT equipment.

In the case where an adjustable aperture is provided, the method may be performed such that if the air flow rate through the opening is below a first pre-set level, the size of the aperture is increased. This increases the amount of cooling air supplied to the IT equipment downstream of the aperture. The size of the aperture at any given time is preferably such that the rate at which cooling air is produced is relatively low (preferably as low as possible) while still being sufficient to meet the demand of the IT equipment at that time. The method may be performed such that if the air flow rate through the opening is below the first pre-set level and the size of the aperture has been increased to its operational maximum size, the rate at which cooling air is produced is increased.

The method may be performed such that if the air flow rate through the opening is above a second pre-set level, the rate at which cooling air is produced is reduced. This may be done by decreasing the speed of the variable speed fan, which reduces the energy usage of the data centre. The method may be performed such that if the air flow rate through the opening is above the second pre-set level, the size of the aperture is reduced. The size of the aperture may be so reduced in the case where the rate at which cooling air is produced has already been reduced to a relatively low level, for example to a level deemed to be the operational minimum. The first and second pre-set levels may be different. In the embodiment described below the first and second pre-set levels are equal. The first and second pre-set levels need not represent large air flow rates. The first and second pre-set levels may be low air flow rates, for example an air flow rate where the speed of the air flowing is less than 1 ms$^{-1}$.

The IT equipment may be arranged so that substantially all of the cooling air passes through the IT equipment along air flow paths internal to the items of IT equipment. Ensuring that cooling air only passes through the inside of each item of IT equipment and does not pass in between the items of IT equipment may improve the cooling effect of the air on the IT equipment. Blanking panels may be used to prevent air flowing between individual items of IT equipment. Blanking panels may be used to prevent air flowing between the IT equipment and the floor of the cold region. Blanking panels may be used to prevent air flowing between the IT equipment and the ceiling of the cold region. Blanking panels may be used to prevent air flowing between the IT equipment and the walls of the cold region.

The data centre may have a plurality of hot regions and cold regions. Each of the plurality of cold regions may be fed with cooling air via a dedicated variably sized aperture. This allows a different amount of cooling air to be supplied to each cold region, which is advantageous since the demand of the IT equipment cooled with air from each cold region may be different. In this case the method may comprise the steps of measuring the air flow rate through a first opening between a first hot region and a first cold region and measuring the air flow rate through a second opening between a second hot region and a second cold region, and supplying cooling air to IT equipment, on the one hand, between the first hot region and the first cold region and, on the other hand, between the second hot region and the second cold region, in dependence on the first and second measured air flow rates. It will be appreciated of course that there may be more than one opening between each pair of hot and cold regions, such that the measured air flow rate through the first opening is combined with, or otherwise used in conjunction with, a measured air flow rate through one or more further openings between the first cold region and the first hot region.

The method may be performed such that if the air flow rate through the first opening or the second opening is below the first pre-set level, the size of the aperture associated with the cold region connected to that opening is increased. The method may be performed such that if the air flow rate through the first opening or the second opening is below the first pre-set level and the size of the aperture associated with the cold region connected to that opening has been increased to its operational maximum size, the rate at which cooling air is produced is increased.

The method may be performed such that if the air flow rate through one of the first opening and the second opening is above the second pre-set level and the size of the aperture associated with the cold region connected to the other of the first opening and the second opening is not at its operational maximum size, the rate at which cooling air is produced is decreased. The method may be performed such that if the air flow rate through one of the first opening and the second opening is above the second pre-set level and the size of the aperture associated with the cold region connected to the other of the first opening and the second opening is at its operational maximum size, the size of the aperture in the cold region connected to the opening through which the air flow rate is above the second pre-set level is reduced. The method may be performed such that if the air flow rate through the first opening is above the second pre-set level and the air flow rate through the second opening is above the second pre-set level, the rate at which cooling air is produced is decreased. Thus the amount of cooling air supplied to each cold region may be tailored to meet, with great accuracy, the cooling demand of the IT equipment drawing air from that cold region at any given time. The speed of the variable speed fan may therefore be able to be reduced to be as low as possible while still being sufficient to meet the cooling demand of the region with the highest cooling requirements. In such a case, the aperture (or apertures) associated with the region having the highest cooling requirement id advantageously controlled to be at its operational maximum size.

The method may be performed such that it includes the step of defining a maximum rate of production of cooling air in dependence on one or more characteristics of the IT equipment, and cooling air is produced at a rate less than or equal to this maximum rate. The maximum rate of production of cooling air may be defined in dependence on the power usage of the IT equipment. It may be defined in dependence on the theoretical maximum requirement of the IT equipment for cooling air. It may be greater than 120% of the maximum requirement of the IT equipment for cooling air. It may be greater than twice the maximum requirement of the IT equipment for cooling air. Providing such a maximum limit for the rate of production of cooling air improves the energy efficiency of a data centre in which the method is performed. This is because in situations where the rate of production of cooling air otherwise might temporarily increase by a significant amount unnecessarily, for example if the removal of baffles in the cold aisle during maintenance allowed some cooling air to pass directly from the cold aisle to the hot aisle without passing through the IT equipment, the provision of a maximum rate will prevent the apparatus producing the cooling air from operating at too high a level and using an excessive amount of energy.

The cooling air may be produced from supply air, the supply air comprising ambient air from outside the data centre, or air exhausted by the IT equipment in the data centre, or a mixture of air from outside the data centre and exhaust air. How much, if any, ambient air and how much, if any, exhaust air the supply air comprises may be controlled in dependence on the temperature and relative humidity of the outside air.

Preferably, production of cooling air is controlled to have temperature and relative humidity within certain pre-defined limits. The control of the cooling air to have temperature and relative humidity within certain pre-defined limits may consist of ensuring that the air has the ability to cool the IT equipment. The cooling air may be produced by adjusting the temperature and relative humidity of the supply air to be within the pre-defined limits by any one of mechanical cooling, adiabatic cooling, or a combination of mechanical and adiabatic cooling. How much, if any, mechanical cooling, and how much, if any, adiabatic cooling is used to adjust the temperature and relative humidity of the supply air to within the pre-defined limits may be controlled in dependence on the temperature and relative humidity of the outside air. Preferably no mechanical cooling is used for the majority of the time, which means that the energy usage of the data centre is very low.

According to a second aspect of the invention there is also provided a method of cooling a data centre with cooling air, wherein the method comprises the following steps:

(a) defining criteria for the temperature and relative humidity of the cooling air, wherein the criteria are a range of temperatures and a range of humidities;

(b) determining the temperature and relative humidity of ambient air from outside the data centre;

(c) determining a set point for each of the temperature and relative humidity of cooling air, the set point satisfying the criteria defined in step (a) and being chosen in dependence on the temperature and relative humidity of the ambient air;

(d) producing cooling air having temperature and relative humidity substantially equal to those set points; and (e) delivering the cooling air to a region in the data centre to be cooled.

The range of humidities at which the cooling air is deemed to be substantially equal to the set point for relative humidity may be wider than the range of temperatures at which the cooling air is deemed to be substantially equal to the set point for temperature. For example in some embodiments a ±2% tolerance on temperature may be too great, whereas a ±2% tolerance on relative humidity would be acceptable. In certain embodiments, a ±5% tolerance (or even a ±10% tolerance) on relative humidity may be acceptable.

The method may further comprise the following steps:

(f) removing exhaust air from the region of the building to be cooled, the exhaust air including air heated as a result of heat exchange between the cooling air and the region in the building to be cooled; and (g) choosing how much, if any, of the exhaust air and how much, if any, of the ambient air are used during step (d) to produce the cooling air in dependence on the temperature and relative humidity of the ambient air.

The criteria defined in step (a) may be such that they may be represented on a psychrometric chart by a single point. The criteria defined in step (a) may be such that they may be represented on a psychrometric chart by a single line. This line is preferably a line of finite length; however it may be a closed loop. Conditions corresponding to any of the points on the line will satisfy the criteria defined in step (a); however producing cooling air having characteristics represented by some points on the line will require more energy than producing cooling air having characteristics represented by certain other points on the line.

Preferably the step of choosing a set point, for example on such a line, for the temperature and relative humidity of cooling air in dependence on the temperature and relative humidity of the ambient air at a given time is carried out such that producing cooling air with temperature and relative humidity at the chosen set point requires no more cooling energy than producing cooling air with temperature and relative humidity represented by any of the other points on the line. This means that the most efficient possible process for producing cooling air is always used.

Step (d) of the method may include a first stage of producing cooling air having relative humidity higher than the set point for the relative humidity of cooling air and temperature lower than the set point for the temperature of cooling air, and a second stage of raising the temperature and lowering the relative humidity of the cooling air so produced, by passing it through a fan, so that the temperature and relative humidity of the air are substantially equal to the set points for the temperature and relative humidity of cooling air. The method may therefore include compensating for the temperature rise and humidity drop produced when the air is passed through the fan (or fans). It will be appreciated that the relative humidity may need to be only slightly higher than the set point for the relative humidity of cooling air and that the temperature may need to be set only slightly lower than the set point for the temperature of cooling air, in order to reach the desired set points because the temperature rise (and consequential relative humidity drop) caused by passing the cooling air through the fan(s) will typically be relatively low. The temperature rise caused by passing the cooling air through the fan(s) may be of the order of one or two degrees Centigrade. According to a third aspect of the invention there is also provided apparatus for supplying cooling air to a plurality of items of IT equipment in a data centre having at least one hot region and at least one cold region. The apparatus may comprise an opening between the hot region and the cold region;
an air flow sensor located in said opening for measuring the rate at which air passes through the opening;
a source of cooling air, the cooling air having temperature and relative humidity within certain pre-defined limits, and
an adjustably sized aperture located upstream of the IT equipment and downstream of the source of cooling air.

The apparatus may be arranged such that the rate at which the cooling air is supplied to the IT equipment depends on the air flow rate measured by the sensor. For example, the effective size of the adjustably sized aperture may be adjusted in dependence on an output of the air flow sensor. The opening may be a one-way duct. For example, the duct may define the opening. Other physical structure, separate from the IT equipment, may define the opening. The end of the duct that joins the hot aisle may be covered by a hinged flap, or the duct may include some other form of non-return valve. This prevents hot air from flowing back into the cold aisle, and means that a simple non-directional velocity sensor may be used. Alternatively the duct may be a two-way duct, in which case a directional air flow sensor may be preferred. The air flow sensor may be in the form of an air velocity sensor. The air flow sensor may be arranged to provide an output in dependence on the volume of air that passes through the opening per unit time. The air flow sensor may be arranged to provide an output in dependence on the speed at which air passes through the opening. Of course, the measure of volume of air passing through the opening per unit time may be directly proportional to the speed at which air passes through the opening. The air flow sensor may be in the form of a differential pressure sensor. The opening may be in the form of a simple orifice, across which a differential pressure is measured.

According to a fourth aspect of the invention there is also provided a control system for controlling the cooling of IT equipment in a data centre. The control system may include an input for receiving information about the temperature and relative humidity of ambient air outside the data centre;
memory for storing pre-loaded criteria for the relative humidity and temperature of the cooling air, said criteria covering a range of temperatures and a range of humidities, and
a processor for:
(a) determining a set point for each of the temperature and relative humidity of the cooling air in view of the pre-loaded criteria and the information received about the temperature and relative humidity of the ambient air;
(b) determining how much, if any, of the exhaust air and how much, if any, of the ambient air are used by the source of cooling air to produce cooling air having temperature and relative humidity substantially equal to the set points, in view of the information received about the temperature and relative humidity of the ambient air; and
(c) determining how much, if any, mechanical cooling and how much, if any, adiabatic cooling is used by the source of cooling air to produce cooling air having temperature and relative humidity substantially equal to the set points.

The processor may perform operations (a), (b) and (c) in view of the information received about the temperature and relative humidity of the ambient air.

Operations (a), (b) and (c) may be carried out by software installed onto the memory of the control system. The control system may be programmed with different pre-loaded criteria according to the type of IT equipment in the data centre at any given time. The control system may be arranged for connection to, and control of, a source of cooling air. The control system may be arranged for connection to, and control of, physical means for varying the amounts of exhaust air and ambient air used in generating the cooling air. For example, the control system may be arranged for connection to, and control of, one or more dampers, valves or the like.

The present invention also provides, according to a fifth aspect, apparatus for cooling air, preferably for adiabatically cooling air. In the context of the present invention a cooling process may be considered as an "adiabatic" process if there is no change, or very little change, in enthalpy. It will be appreciated that a cooling process in which there is some, for example negligible, heat exchange with the external environment may still be considered, in a practical sense, as an adiabatic cooling process. This apparatus may comprise a cooler having at least a first section and a second section, wherein the first and second sections are individually selectively operable. Air may for example be cooled by means of passing over or through the one or more sections of the cooler. Each section may itself have a limited, finite, number of settings (for example operating states) for varying the amount of cooling provided by an individual section. The number of settings may be fewer than five. The number of settings may be two, in that each section may itself only be controlled by selectively operating the section or not operating the section (i.e. simple "on/off" control). The cooler may have three or more individually operable sections. Preferably the cooler has ten or fewer such sections. Preferably all sections of the one cooler are arranged in parallel (for example, not arranged in series). For example, an array of such sections may be provided in a single plane. Sections of the cooler may be arranged adjacent to each other. The cooler may be in the form of an evaporative cooling apparatus. The cooler may be in the form of adiabatic cooler. The apparatus for cooling air may comprise an adjustably sized aperture, for example a bypass damper (i.e. a damper which allows air to bypass the sections of the cooler). Preferably the adjustably sized aperture is arranged in parallel with the cooler. Preferably, the adjustably sized aperture and the cooler are accommodated in the same airflow channel. Preferably, the apparatus is so arranged that air flowing along the channel from a position upstream of the apparatus to a position downstream of the apparatus must pass via either one or more sections of the cooler or the adjustable aperture. The apparatus may be arranged such that in use air is permitted to pass through a non-operating section of the cooler. Operation of a section of the cooler may comprise introducing moisture, for example a flow of water, into the section. The apparatus is preferably so arranged that the amount of cooling provided by the apparatus depends on both how many sections of the cooler are in operation and the size of the adjustably sized aperture. Advantageously, this arrangement allows for a much finer degree of control over the amount of cooling (for example the amount of adiabatic or evaporative cooling) provided by the apparatus than could be achieved without using an adjustably sized aperture. It will be appreciated that this advantage is more pronounced the lower the number of sections and the lower the number of operating states (or cooling settings) that each section has. Having such a fine degree of control available may allow the amount of cooling provided to be closely matched to the cooling demand at any given time. Having such a fine degree of control available may allow the operation of a control regime in which set points for the temperature and relative humidity of cooling air can be reached and maintained with a high degree of accuracy.

For example, a method of cooling, for example IT equipment in a data centre, may utilise the aforesaid apparatus by operating at least one but not all of the sections, and then increasing the amount of cooling (for example providing the same rate of flow of air but at a lower temperature) by means of reducing the size of the adjustable aperture, thereby forcing more air through the sections of the cooler. The method may include a step (as cooling demand increases still further) of then closing the aperture completely such that substantially all air passes through the sections of the cooler. The method may include a step of then causing a further single section of the cooler to become operational.

The method may include a step of performing the cooling method for a set time (thereby introducing a delay) with the adjustable aperture at a pre-set position (for example, fully closed) before changing the number of sections of the cooler which are operational. Introducing such a delay can be useful in maintaining a smooth and/or efficient cooling regime. At substantially the same time (just before, just after, or at exactly the same time) as a new section of the cooler is made operational, the adjustable aperture may start moving to a pre-set position. For example, the adjustable aperture may move to be a position (i.e. size of aperture) at which the amount of cooling provided by the apparatus, once the extra section is fully operational, is substantially the same as the amount of cooling provided by the apparatus immediately before both the extra section was made operational and the position of the aperture was so moved. In this manner, the amount of cooling provided by the apparatus can, in effect, be smoothly varied as extra cooling sections are made operational. The preset position to which the aperture moves may depend on the number of sections which are operational.

It will be appreciated that order of the steps of the method just described (in the context of the cooling demand being greater than the cooling provided—i.e. a condition where more cooling is needed) is important but that not all steps need be performed. For example, the aperture need not be closed completely before causing an extra cooling section to become operational.

A method of cooling may similarly include steps which are performed when the cooling demand is less than the cooling provided (i.e. a condition where less cooling is needed). For example, a method of cooling may utilise the aforesaid apparatus by operating at least two of the sections, and then decreasing the amount of cooling by means of increasing the size of the adjustable aperture, thereby passing less air through the sections of the cooler and more through the aperture. The method may include a step (as cooling demand decreases still further) of then opening the aperture completely. The method may include a step of then causing a further single section of the cooler to become non-operational.

The method may include a step of performing the cooling method for a set time (thereby introducing a delay) with the adjustable aperture at a pre-set position (for example, fully open) before changing the number of sections of the cooler which are operational.

At substantially the same time (just before, just after, or at exactly the same time) as an operational section of the cooler is made non-operational, the adjustable aperture may start moving to a pre-set position.

The preset position to which the aperture moves may depend on (a) whether cooling demand is not being met or cooling demand is being more than met and (b) the number of sections which are operational.

A sixth aspect of the invention provides apparatus for controlling the rate of flow of air into, from, or within a data centre (for example to control exhaust of air from a data centre), the apparatus comprising at least a first adjustably sized aperture and a second adjustably sized aperture, wherein each adjustably sized aperture is arranged to be individually controlled. Advantageously, this arrangement allows a better degree of control over flow rates, for example the rate at which air is exhausted from the data centre, than can be achieved with an arrangement in which all of the adjustably sized apertures are controlled together (so that each aperture is opened or closed by the same amount in parallel, in contrast to the present aspect of the invention where the apertures may be opened and closed in sequence). Each adjustably sized aperture may comprise a set of damper blades. Each adjustably sized aperture may be located at or near the point of exhaust from the data centre. The adjustably sized apertures are preferably arranged in parallel with each other (as opposed to arranging apertures in series in which arrangement air would pass thorough each of the apertures in turn).

A method of controlling the rate of air exiting a data centre according to this sixth aspect is also provided. Such a method may comprise the steps of providing a data centre having one or more fans generating an air flow and a plurality of adjustably sized apertures arranged to control the rate of air flow, for example from inside the data centre to outside the data centre. There may be steps of causing air to exhaust from the data centre at a first rate during which one or more of the adjustably sized apertures are at least partially open, and then moving one but not all of the adjustably sized apertures to cause air to exhaust from the data centre at a second, different, rate. The method may include having one or more apertures in a fully closed position and one aperture partially open, then fully opening that aperture before starting to open one of the fully closed apertures. The method may include having one or more apertures in a fully open position and one aperture partially open, then fully closing that aperture before starting to close one of the fully open apertures.

The method may include moving the adjustably sized apertures in sequence as the flow rate (for example exhaust rate) is varied from a lower rate to a higher rate such that the adjustment in flow rate is effected at lower flow rates by moving a first set of one or more apertures whereas the adjustment in flow rate is effected at higher flow rates by moving a second different set of one or more apertures. The method may include varying the sequence. For example, the method may include using at least one adjustably sized aperture to enable variation of the air flow rate across a range of lower rates at one instant and then at another instant using that same adjustably sized aperture to enable variation of the air flow rate across a higher range of rates not including the lower range. The method may alternatively or additionally be used to control the rate of air entering a data centre. The method may be used to control the rate of air moving from one part of a data centre to another part of that data centre.

A seventh aspect of the present invention provides a method of accessing a first space in a data centre, the first space having a high airflow due to the operation of at least one variable speed fan, from a second space, the second space having a low or zero airflow. There may for example be a door between the first space and the second space. There may be a relatively large differential pressure across the door as a result of the airflows in the first space making it difficult and/or dangerous to open the door manually.

The method according to this seventh aspect of the present invention may include the steps of:

operating the at least one variable speed fan at a first (for example relatively high) speed;

operating the at least one variable speed fan at a second, pre-determined (for example relatively low), speed for a first pre-determined time period; and operating the at least one variable speed fan at the first speed for a second pre-determined time period after the first time period has elapsed.

The door may be opened during the period when the at least one variable speed fan is operating at the second speed. This method may thus allow easy and safe access to areas housing the air treatment apparatus for a data centre while the apparatus is in operation. The second speed is preferably sufficiently low to enable the door to be opened and closed safely. The method is preferably controlled by a control unit. The method may be used to enable access to the first space by a person to engage in maintenance work. The method may include operating the at least one variable speed fan at the second speed for a first pre-determined time period in response to a manually made request, for example to open the door. For example the request may be provided by pressing a door-release button, lever, or the like.

The present invention also provides, according to an eighth aspect, a method of operating a data centre in a first mode in which substantially all of the cooling done is mechanical cooling, and subsequently operating the data centre in a second mode in which a significant proportion of the cooling done is adiabatic cooling. The method may include a step of providing adiabatic cooling apparatus in an offline state and then operating the adiabatic cooling apparatus simultaneously with the mechanical cooling apparatus for a pre-set time period. The adiabatic cooling apparatus may be operated at a level dependent on the temperature and relative humidity of ambient air outside the data centre. The method may be performed such that the adiabatic cooling apparatus is initially operated at a level which represents a significant proportion of the operational maximum of the apparatus (for example at least 40%, and preferably at least 50%). The method may include a step of reducing the level of operation of the mechanical cooling apparatus to a level dependent on the temperature and relative humidity of the ambient air, when the pre-set time period has elapsed. When the adiabatic cooling apparatus is in an offline state for any significant length of time, the moisture retaining parts of the apparatus have a tendency to dry out. When initiated there can therefore be a significant time-lag before the adiabatic cooling apparatus reaches its steady state cooling levels, at any given level of desired cooling capacity.

Advantageously, this method ensures that the adiabatic cooling apparatus is sufficiently wet to be able to provide the level of cooling required (i.e. to convert ambient air into cooling air of the required characteristics) immediately after the mechanical cooling apparatus is turned off, despite the time it might take for the adiabatic cooling apparatus to reach its steady state cooling rate when it is brought online. The method may therefore, for a short-time, cause the cooling air to be cooler than required as the adiabatic cooling apparatus is operated in parallel with the mechanical cooling apparatus during pre-set time period. The pre-set time period may be considered as a transition period between the first and second modes of operation. The first mode of operation (in which substantially all of the cooling done is mechanical cooling) may be such that the data centre re-circulates fully the exhaust air and draws little or no ambient air during operation. Such a (fully re-circulating) mode may be engaged when the outside air is very warm or when a fire alarm or VESDA alarm is triggered. The second mode of operation (in which a significant proportion of the cooling done is adiabatic cooling) may be such that the cooling air is composed substantially entirely of ambient air from outside the data centre (a "fresh air" mode). This method may be used when the data centre is changed from a fully re-circulating mode to a fresh air mode because the fire alarm or VESDA alarm has been triggered when there is, in fact, not a fire.

The adiabatic cooling mentioned above may be in the form of evaporative cooling. The eighth aspect of the invention also has application in the case where heat is exchanged, for example extra cooling is performed, alongside or in combination with the adiabatic cooling. For example, an evaporative cooler may reduce the temperature of the air in a manner that is effectively a combination of perfect adiabatic cooling and heat exchange, whether positive or negative. The second mode of cooling may therefore be one in which a significant proportion of the cooling done is evaporative cooling, whether or not adiabatic.

According to a ninth aspect, the present invention provides a method of operating a data centre in a first mode in which most or all of the cooling is not provided by mechanical cooling and subsequently operating the data centre in a second mode in which substantially all of the cooling is provided by mechanical cooling, the method including the following steps:

defining a target value for cooling air produced by the mechanical cooling apparatus, wherein this target value is significantly lower than the temperature of cooling air produced when the data centre is operating in the first mode;

increasing the target value by a pre-set amount over a pre-set period of time; and operating the mechanical cooling apparatus at a level dependent on the target value.

The target value may be gradually increased over time to a final steady-state target value. By initially setting the target value to a value that is significantly lower than the final steady-state target value, the mechanical cooling system may effectively be run at a level significantly higher than the level that would be necessary to achieve the final steady-state target value in the most energy efficient manner possible. However, by over-driving the mechanical cooling system initially, there is less of a risk of an unintentional increase in temperature as a result of lag in the system. The mechanical cooling system may be run at a relatively high level temporarily in order to achieve the final steady-state target value in a timely manner.

This method has the advantage that it may act to force the mechanical cooling apparatus to operate at its maximum level as soon as the data centre is switched into a mode in which all of the cooling demand must be met by the mechanical cooling apparatus. There is therefore a reduced risk of the mechanical cooling apparatus not being able to meet this cooling demand because the DX system is operating at too low a level. If the mechanical cooling apparatus were allowed to adjust to the change in mode automatically, the delay in bringing additional DX cooling coils online could mean that the temperature of the cooling air supplied to the servers would rise to unacceptable levels for a period of time.

The second mode of operation in this aspect of the invention (in which substantially all of the cooling done is mechanical cooling) may be such that the data centre re-circulates fully the exhaust air and draws little or no ambient air during operation. The first mode of operation in this aspect of the invention may be such that a significant proportion of the cooling is not provided by mechanical cooling. It may be that none of the cooling is provided by mechanical cooling during the first mode.

According to a tenth aspect, the present invention provides a method of operating a data centre having a smoke detection system and mechanical cooling apparatus, wherein the smoke detection system has detected smoke and a significant proportion of the mechanical cooling apparatus has become inoperable. The method may include a step of operating the data centre in a mode in which the cooling air is composed substantially entirely of ambient air from outside the data centre and in which substantially none of the cooling is provided by mechanical cooling (for example, a "fresh air cooling" mode). Whilst on detection of smoke it may be preferable to operate in a mode in which mechanical cooling is used and in which exhaust air is re-circulated, if sufficient mechanical cooling is unavailable and there is no fire alarm activated it may be preferable to utilise a fresh air cooling mode instead. (It may be better, in the case of a combination of a mechanical cooling fault and smoke alarm situation, to keep the IT equipment cool if the risk of fire is still judged as low, than to over-react to a fire-risk and prejudice the proper function of the IT equipment.) Apparatus suitable for detecting a fire within the data centre may be provided, for example in the form of a fire alarm system. In the case where a fire is subsequently detected within the data centre, the method preferably includes a step of operating the data centre in a mode in which the cooling air is composed substantially entirely of exhaust air and in which substantially all of the cooling is provided by mechanical cooling (for example, a fully re-circulating mode).

Advantageously, this method ensures that the electronic equipment in the data centre is kept cool enough in the event that smoke is detected in the data centre and the mechanical cooling apparatus experiences a partial failure. If, as would be the usual response to detecting smoke, the data centre was switched into full re-circulation mode, the mechanical cooling apparatus that was still operational would not be able to meet the demand for cooling air and the electronic equipment could overheat. However, if an actual fire is detected within the data centre, it is more important to control the fire risk than to keep the servers cool so the data centre is switched into full-recirculation mode, notwithstanding the reduced mechanical cooling capacity, so that fire suppressant gas can be deployed.

A final aspect of the present invention provides a method of monitoring the status of a network of controllers suitable for controlling components of a data centre cooling system. The method may include the steps of:

providing a primary controller arranged to be able to send signals to at least one secondary controller and to receive signals from said secondary controller;

providing at least one secondary controller arranged to be able to receive signals from the primary controller and to send signals to the primary controller;

the primary controller sending a first signal to the secondary controller; and the secondary controller sending a second signal to the primary controller.

The method may be performed such that in the case that either (a) the primary controller does not receive a second signal from the secondary controller during a first pre-set time period or (b) the secondary controller does not receive a first signal from the primary controller during a second pre-set time period (which need not necessarily be different from the first pre-set time period), at least one component of the cooling system is instructed by one of the controllers to enter a failsafe mode.

The method may be performed such that in the case that the primary controller does not receive a second signal from the secondary controller during the first pre-set time period, the primary controller instructs at least a first component of the cooling system to enter a failsafe mode. The method may be performed such that in the case that the secondary controller does not receive a first signal from the primary controller during a second pre-set time period, the secondary controller instructs at least a second component (which may or may not be different from the first component) of the cooling system to enter a failsafe mode.

The method may be performed such that the primary controller sends the first signal to the secondary controller in response to the second signal received from the secondary controller. It will be appreciated therefore that the second signal may be sent before the first signal is sent. The primary controller is preferably arranged to receive signals from a plurality of secondary controllers.

The fail safe mode may include operating one or more fans at or near their operational maximum. The fail safe mode may include moving one or more adjustable apertures to their fully open state. In an embodiment of the invention, the secondary controllers are each associated with a cold region. In that embodiment, adjustable apertures are associated with each cold region. The primary and secondary controllers are preferably linked to each other via a computer network arrangement, such as an Ethernet network. Checking the health of the network in the manner suggested above may be of particular benefit in that a further supervisory control panel or interface need not be required for the purpose of checking the health of the network or for the purpose of reacting to a detected fault.

The method of the invention, according to any of the above aspects, may be implemented by a suitably arranged control apparatus. For example, the control apparatus may be arranged to receive inputs, from which measures of outside air temperature and relative humidity may be ascertained. The control apparatus may be arranged to receive at least one input from an air flow sensor located in an opening, for example in a rack of IT equipment, between a hot region and a cold region. It will be appreciated that other aspects of the invention may require a control unit, or multiple control units, requiring further inputs. The control apparatus may control fan speed. The control apparatus may control the adjustment of adjustable apertures. The control apparatus may control the use of the cooling apparatus mentioned above (for example the apparatus for adiabatic cooling and/or evaporative cooling). The control apparatus may control the use of mechanical cooling. It will be appreciated that other aspects of the invention may require a control unit, or multiple control units, controlling other parts of the data centre.

The control apparatus may comprise one or more programmable control units. The method of the invention may be implemented by means of suitably programmed control units. The invention may therefore extend to the programming of a control apparatus, and for example to programming of one or more control units to perform the methods of the invention. The present invention thus further provides a computer program comprising computer program code means adapted to perform any of the methods of the invention, according to any of the aspects described herein, when said program is run on a programmable controller.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which.

DETAILED DESCRIPTION

Figure 1:
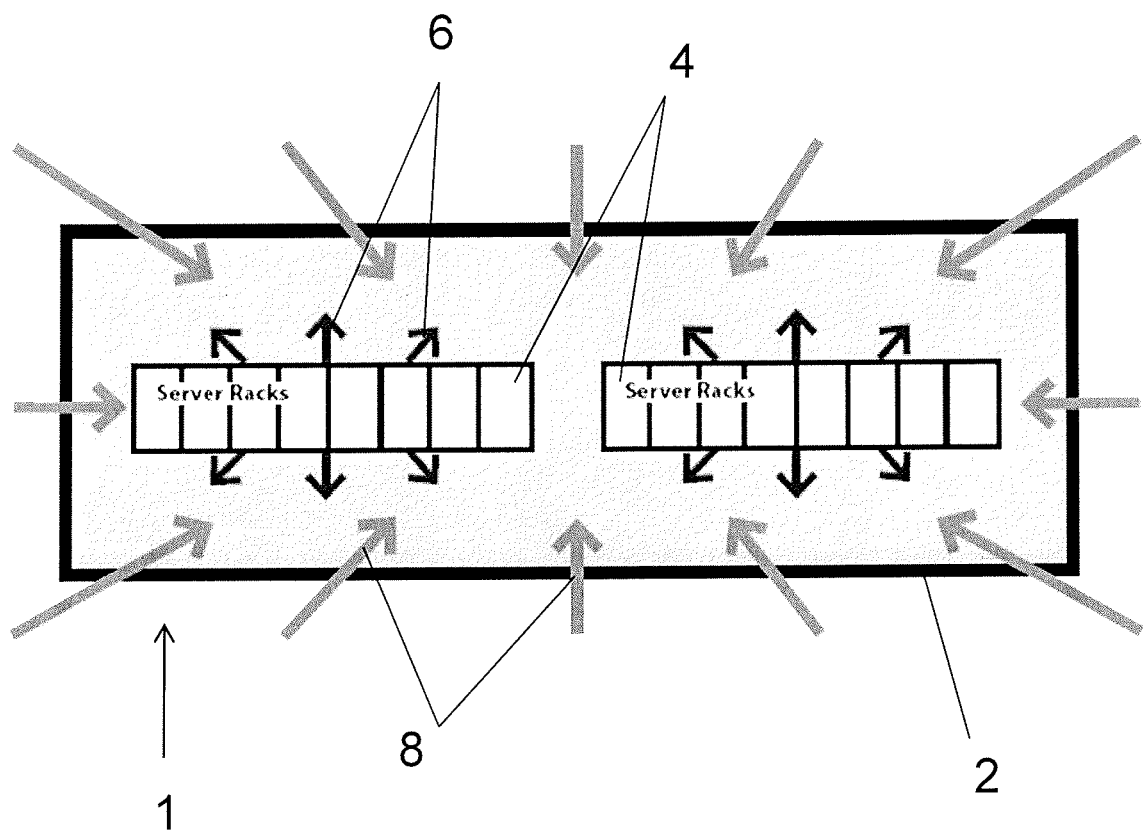
FIG. 1 shows a prior art rack room.
Figure 2:
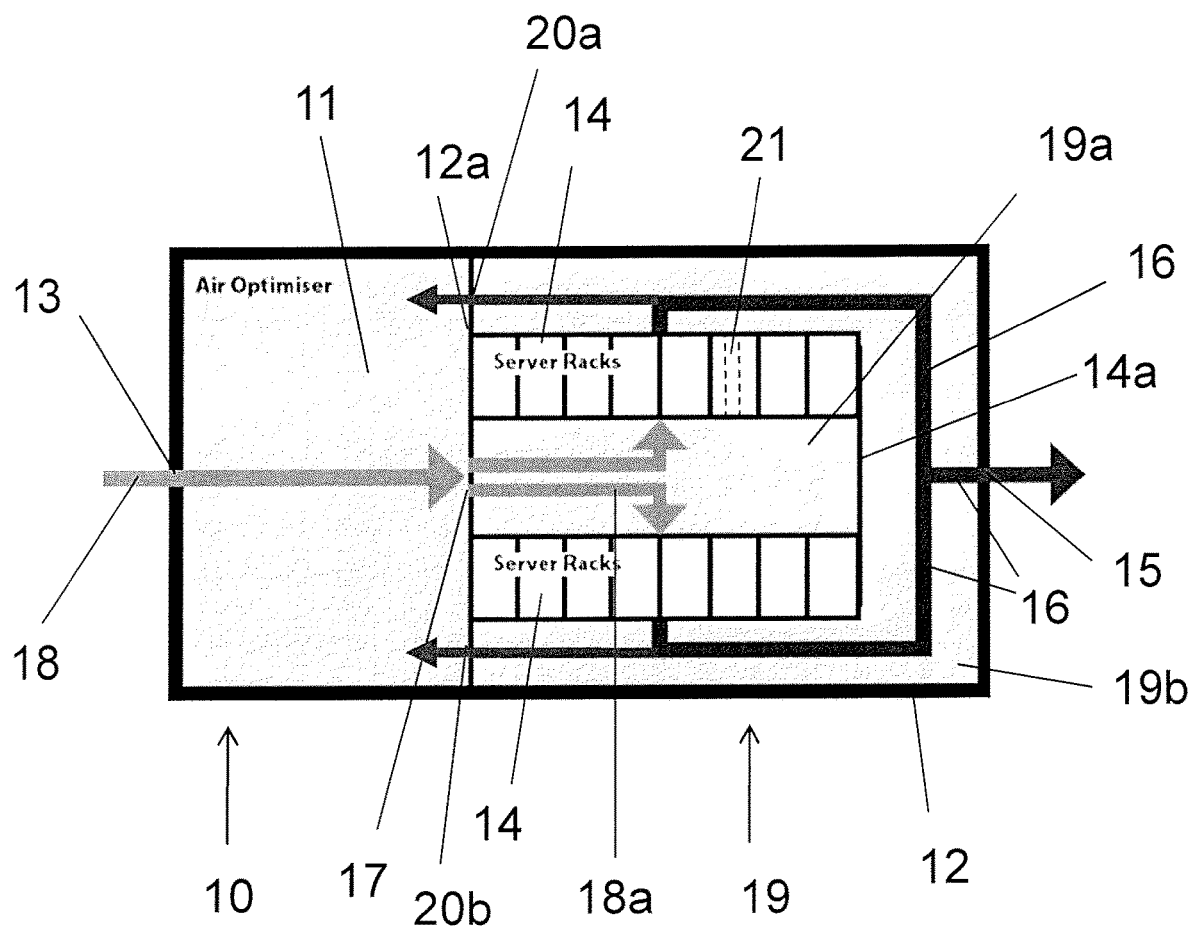
FIG. 2 shows a data centre building according to a first embodiment of the invention.

FIG. 2 shows a data centre building 10 according to a first embodiment of the invention.

The building 10 is rectangular with external walls 12. The building is divided into front and rear sections by an internal dividing wall 12a, located approximately one third of the length of the building from the rear external wall.

The rear section (on the left in FIG. 2) defines an air optimisation room 11, which provides a system of circulating cooling air in the building 10. Ambient air 18 can enter the air optimisation room 11 through an ambient air intake 13 in the rear external wall. Exhaust air 16, which has been heated by IT equipment in the data centre, can enter the air optimisation room through two exhaust air intakes 20a and 20b in the internal dividing wall 12a. The ambient air intake 13 and the exhaust air intakes 20a and 20b are fitted with dampers so that the amount of ambient air and the amount of exhaust air entering the air optimisation room may be controlled. When the ambient air intake damper is shut, no ambient air may enter the air optimisation room. Likewise, when the exhaust air intake dampers are shut, no exhaust air may enter the air optimisation room.

Ambient air 18, exhaust air 16 or a mixture of ambient and exhaust air can be treated/cooled in the air optimisation room and this air 18a is then used for cooling. If the ambient air outside the building 10 is sufficiently cool, the ambient air may be used as cooling air, without requiring any active cooling by the air optimisation room 11. Cooling air 18a passes into the front section of the building 10 through two air passages 17 in the internal dividing wall 12a.

The front section (on the right in FIG. 2) of the building 10 defines a rack room 19. The rack room 19 houses two rows of racks 14; one on either side of the air passages 17. The racks 14 extend away from the internal dividing wall 12a, towards the front of the building. Although only shown schematically in FIG. 2, there are 20 racks in each row, each rack housing up to 40 items of IT equipment (typically server blades). There may therefore be a many as 1,600 items of IT equipment in the racks. A blanking panel 14a extends between the front ends of the two racks, thereby defining a cold region 19a between the internal dividing wall 12a, the two racks 14 and the blanking panel 14a.

A hot region 19b is defined on the other side of the racks 14 and the blanking panel 14a. Air can escape from the hot region 19b though a hot air exit 15 in the front external wall of the building. The hot region and the cold region are made largely air tight through the use of further blanking panels in empty racks and between the top of the racks and the ceiling of the rack room, so that air may only move from the cold region to the hot region through the servers, or through a duct 21.

The duct 21 is located between the top of one of the rows of racks 14 and the ceiling. The duct 21 extends from the cold region to the hot region. The end of the duct that meets the hot region is covered by a hinged flap (not shown), meaning that air may only enter the duct from the cold region and exit it into the hot region, and not vice versa. The duct 21 contains an airflow velocity sensor (not shown).

In use, ambient air 18 enters the air optimisation room 11 through the ambient air intake 13 and/or exhaust air enters the air optimisation room through exhaust air intakes 20a and 20b. The air that enters the air optimisation room will from here on be referred to as supply air. The supply air can consist of just ambient air, just exhaust air, or a mixture of ambient and exhaust air depending on the position of the ambient air intake damper and the position of the exhaust air intake dampers. The supply air is cooled/treated as necessary in the air optimisation room 11 and leaves through air passages 17 as cooling air 18a. The treatment and/or cooling of the supply air may be effected in accordance with the second embodiment described below. The volume of cooling air leaving the air optimisation room is controlled by a variable speed fan (not shown) in the air optimisation room.

The cooling air 18a enters the rack room 19 into the cold region 19a. The cooling air 18a moves over the racks 14 in the rack room 19 to reach the hot region 19b and in the process cools the racks 14. The resulting hot air 16 coming off the racks 14 then leaves the rack room through the hot air exit 15. If the exhaust air intake dampers 20a and 20b are open then some of the hot air 16 will re-circulate back into the air optimisation room 11.

The volume of air flow through the building is at least 12 $m^3 s^{-1}$. Such a high rate of supply of air is sufficient to cool the IT equipment in the room via ambient air cooling alone for ambient air temperatures of up to 24 degrees Celsius. The volume of air supplied to the cold region is adjusted according to the demand of the servers at any given time. How this adjustment is achieved will now be described.

If too much cooling air is being supplied to the cold region—i.e. the volume of air flowing through passages 17 is greater than the volume of air being drawn through the servers—the air pressure in the cold region will increase. As a result, the velocity of the air flowing through duct 21 will increase. The velocity sensor in duct 21 provides velocity information to a control system that controls the speed of the variable speed fan in the air optimisation room 11. When the velocity measured by the velocity sensor is greater than 0.35 m/s, the control system reduces the speed of the fan so that less air is supplied to the cold region.

If too little cooling air is being supplied to the cold region—i.e. the volume of air flowing through passages 17 is less than the volume of air being drawn through the servers—the air pressure in the cold region will decrease. As a result, the velocity of the air flowing through duct 21 will decrease. When the velocity measured by the velocity sensor in duct 21 falls below 0.35 m/s, the control system increases the speed of the variable speed fan so that more air is supplied to the cold region.

Figure 3:
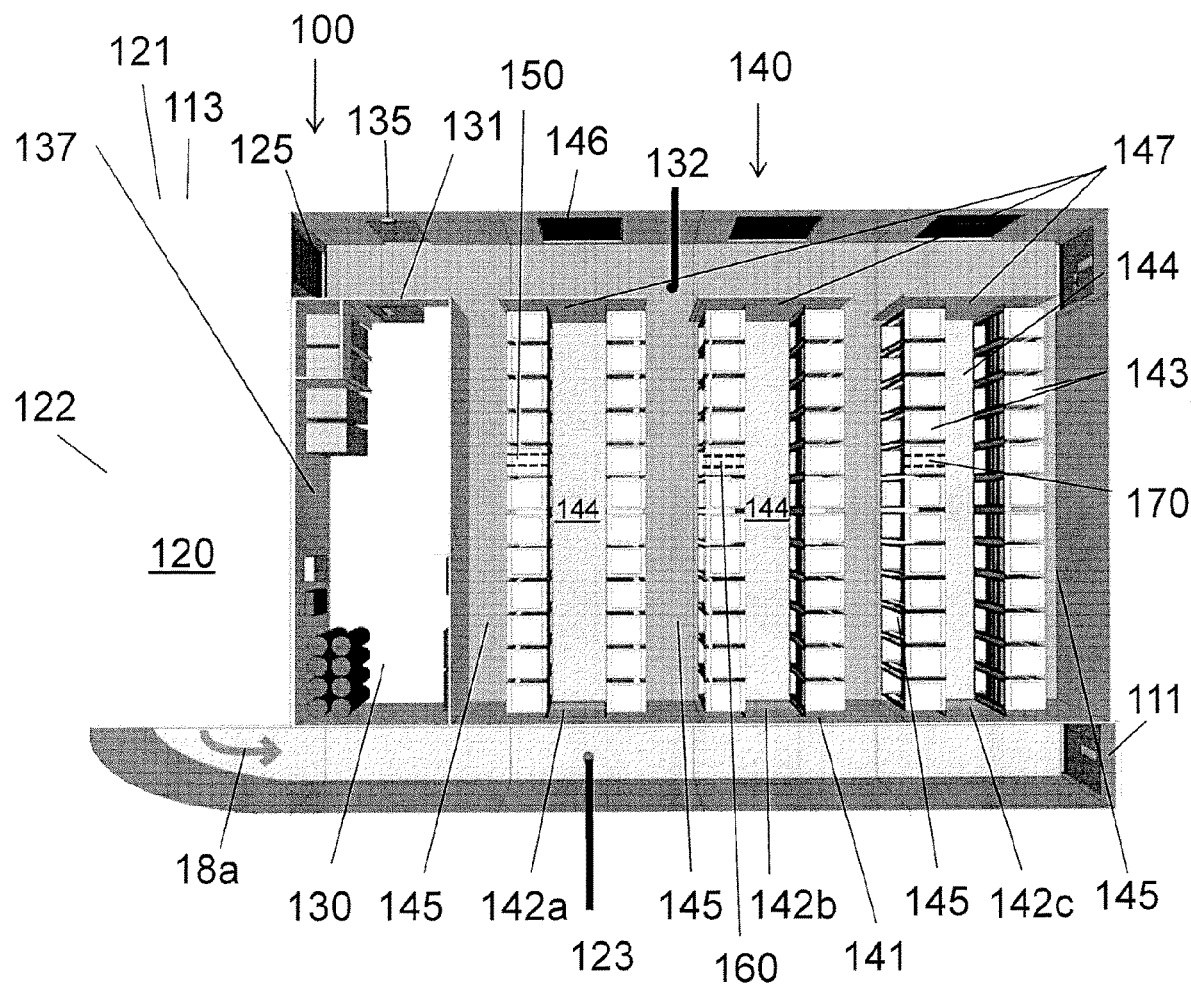
FIG. 3 is a partial plan view of a data centre building according to a second embodiment of the present invention.

FIG. 3 shows a second embodiment of the invention. In the embodiment shown in FIG. 3, there is an air optimisation room 120 located at the rear of the building 100, a plant room 130 located in front of the air optimisation room 120, a rack room 140 located in front of the plant room 130, an above-floor hot air corridor 132 and an above-floor air supply corridor 123.

Figure 6:
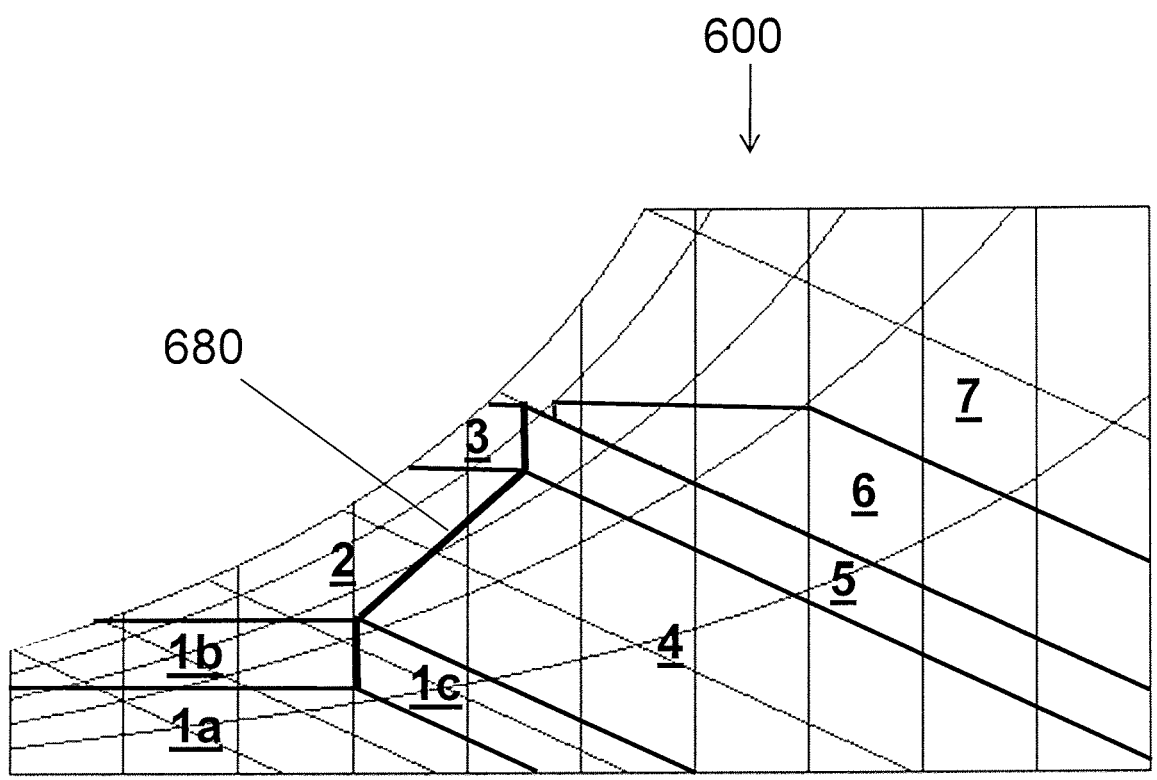
FIG. 6 shows a second example psychrometric chart including a control line and zones.

The air optimisation room 120 contains an air optimisation unit 122, the layout of which is shown in FIG. 6. The air optimisation unit 122 is located adjacent the external right side wall of the data centre building 100 so that an ambient air intake grille 121 on one end of the unit 122 lines up with an ambient air intake hole 113 in the external wall of the data centre. The ambient air intake grille 121 includes a damper that is controllable so that the amount of air entering the air optimisation unit 122 through grille 121 can be controlled.

The air optimisation unit 122 also has a second air intake in the form of a return air grille 125. The return air grille 125 is located at the right, front end of the optimisation unit 122, near the end wall including the ambient air intake grille 121. The return air grille 125 includes a damper that is controllable so that the amount of air entering the air optimisation unit 122 through grille 125 can be controlled.

Figure 7:
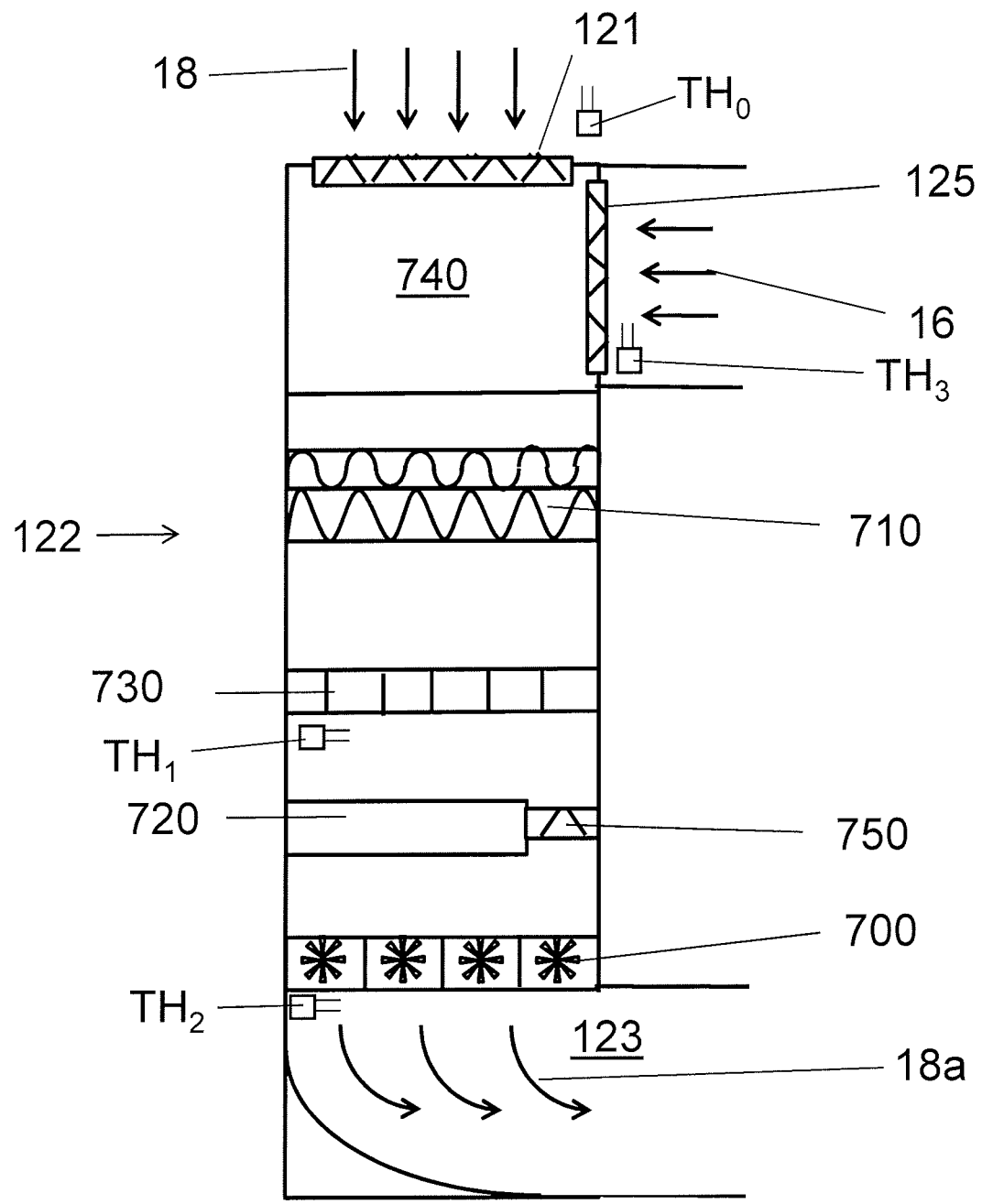
FIG. 7 is a plan view of the air optimisation module of a data centre building according to a second embodiment of the invention.

The air optimisation unit 122 (shown in detail in FIG. 7) contains various air treatment apparatus, including a bank of variable speed fans 700, air filters 710, an adiabatic cooler 720 and six DX cooling coils 730. The air optimisation unit 122 also contains an air mixing box 740 for mixing the air from return air grille 125 and ambient air intake grille 121. The unit 122 also contains sound attenuation apparatus.

The wall between the plant room 130 and the air optimisation room 120 includes several doors (not shown), through which the air treatment apparatus may be accessed for maintenance. When the fans 700 are operating at more than 35% of their maximum speed, the pressure differential between the air optimisation unit 122 and the plant room 130 is such that it is very difficult to open these access doors. So that the air treatment apparatus may be inspected and maintained while the cooling system is in operation, there is a switch in the plant room and switches next to each of the access doors on the air optimiser unit side.

When any of these switches is activated, the normal control process for the fans 700 is overridden and their speed drops to a low level for 8 seconds. This allows the door to be opened safely. After the 8 seconds has elapsed, the fans 700 then operate at the speed at which they were operating when the switch was pressed for 2 minutes, after which normal control is resumed.

To the left side of the air optimisation unit 122 is an air supply corridor 123. The air supply corridor 123 runs above-floor from the rear external wall, and along and in between the left side of the air optimisation unit 122 and the left external side wall.

To the right side of the plant room 130 is a hot air corridor 132 running above-floor along the width of the plant room 130 and along the external side wall of the building. The hot air corridor 132 also extends around the front of the plant room 130, in between the front plant room wall and the rear side of the left-most row of racks. This corridor also extends into the spaces 145 between the rear sides of the other rows of racks. This allows air from the rack room 140 to enter the hot air corridor 132.

On the left end wall of the plant room 130 is a plant room access door 131. The door 131 allows access to the plant room 130 from the hot air corridor 132.

The plant room 130 contains an air optimiser control panel 137, mounted on an internal side of the plant room walls. The air optimiser control panel 137 receives data from various sensors inside the building 100 and an outside ambient air temperature and relative humidity sensor $TH_O$. This outside ambient air temperature sensor $TH_O$ is placed outside the building 100 near the ambient air intake grille 121. Sensor $TH_O$ actually comprises two separate temperature and humidity sensors, and the temperature and humidity values provided to the air optimiser control panel 137 are averages of the values measured by the two sensors.

The air optimiser control panel 137 also receives data from three rack room control panels (not shown), each of which is located at the end one of the cold aisles 144.

The air optimiser control panel includes processors and memory for storing pre-programmed instructions and control software. The air optimiser control panel uses the information received from the sensors and the rack room control panels together with the pre-programmed instructions to control the fans, humidification apparatus, cooling system and the ambient air intake, exhaust and return dampers in order to achieve effective cooling of the racks in the rack room 140.

The plant room 130 also contains fire suppression apparatus and a VESDA (Very Early Warning Smoke Detection Apparatus) fire detection monitoring panel, mounted on an internal side of the plant room walls 134. Fire suppression gas discharge cylinders are connected to the air optimisation unit 122 so that in the event of a fire (when the VESDA monitoring panel is triggered), gas from the cylinders can be discharged through the air optimisation unit 122 into air supply corridor 123.

The rack room 140 contains six elongate rectangular rack storage areas, the areas being parallel to each other. Hence, a passageway running along and in between the rear external wall of the building and the rear internal wall 141 of the rack room 140 is defined. This passageway runs along the width of the rack room 140 and is closed off from the rack room area by the internal wall 141. The passageway forms part of the air supply corridor 123.

Each rack storage area is effectively defined by a single row of racks 143 running lengthways along the rack room 140, i.e. widthways across the building, from the internal wall 141 to the rear end of the rack room area. The rack storage areas are arranged in three pairs such that when racks have been installed in the rack storage areas and the racks have been filled with servers, each pair of rack storage areas includes two rows of racks 143 arranged face-to-face. Between the front faces of the rows of racks making up each pair is a cold region in the form of an above-floor cold aisle 144.

Figure 8:
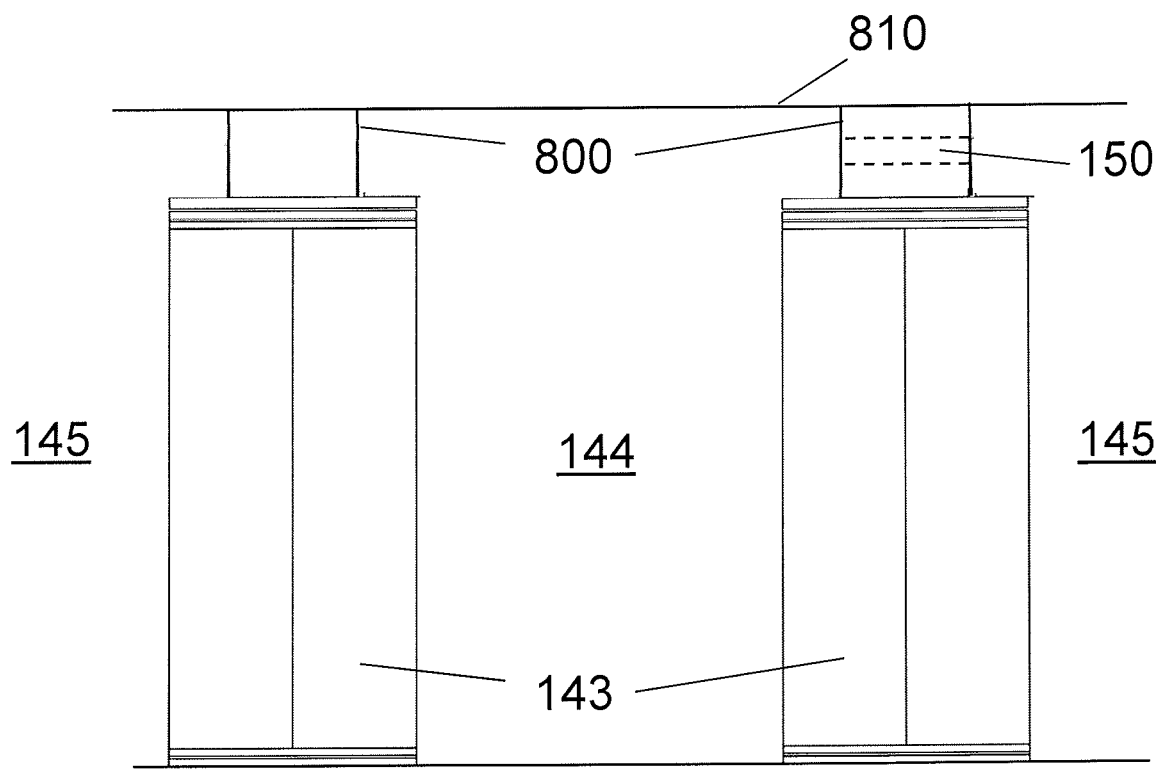
FIG. 8 is an end view of two adjacent rack storage areas according to a second embodiment of the invention.

At the rear end of the rack room area, spanning across the ends of the two rack rows making up each pair, is a cold aisle blanking panel 147 designed to close off the cold aisle 144 at the rear end. As shown by FIG. 8, above the front face of each row of racks 143 there are over-rack blanking plates 800 between the top of the racks and the ceiling 810 of the rack room 140, which are designed to stop cold air travelling over the racks 143. Blanking plates are also used to prevent air flow through any other spaces between the racks and the floor, ceiling or ends of the cold aisle, as well as through spaces in the racks where there is no IT equipment. Above each row of racks there is also a duct 150, 160, 170 joining each cold aisle 144 to each hot region 145 between the back of the racks. These ducts 150, 160, 170 pass through holes in the over-rack blanking plates 800. The end of each duct 150, 160, 170 that joins the hot region 145 is covered by a hinged flap (not shown). Ducts 150, 160 and 170 are of rectangular cross-section measuring approximately 110 mm×54 mm. Each duct 150, 160, 170 contains an air flow velocity sensor (not shown), which provides air flow velocity information to a rack room control panel (not shown). Hence, air can only leave the cold aisles 144 through the racks 143 and through the ducts 150, 160 and 170. Each cold aisle has its own rack room control panel, located on the cold aisle blanking panels 147.

Air from the supply air corridor 123 can enter the cold aisles 144 through cooling air intake grilles 142, located on the internal wall 141 (i.e. above-floor) in between the rows of racks 143. The grilles 142 include dampers 182. Each damper 182 is controlled by the rack room control panel for its respective aisle so that a desired air flow regime can be achieved.

The rack room control panels use proportional-integral (PI) controllers to control the dampers 182. A PI controller uses two separate parameters which may be thought of as the reaction to the current error, and the reaction to the accumulation of past errors. A weighted sum of these two parameters is used to determine the actual reaction, for example how the dampers 182 move in response to a change in the airflow velocity measured by the sensors. The PI algorithm used by the controller is tuned to provide optimal control of the dampers, such that the position quickly stabilises at the optimal value and does not oscillate around it for very long.

Figure 4:
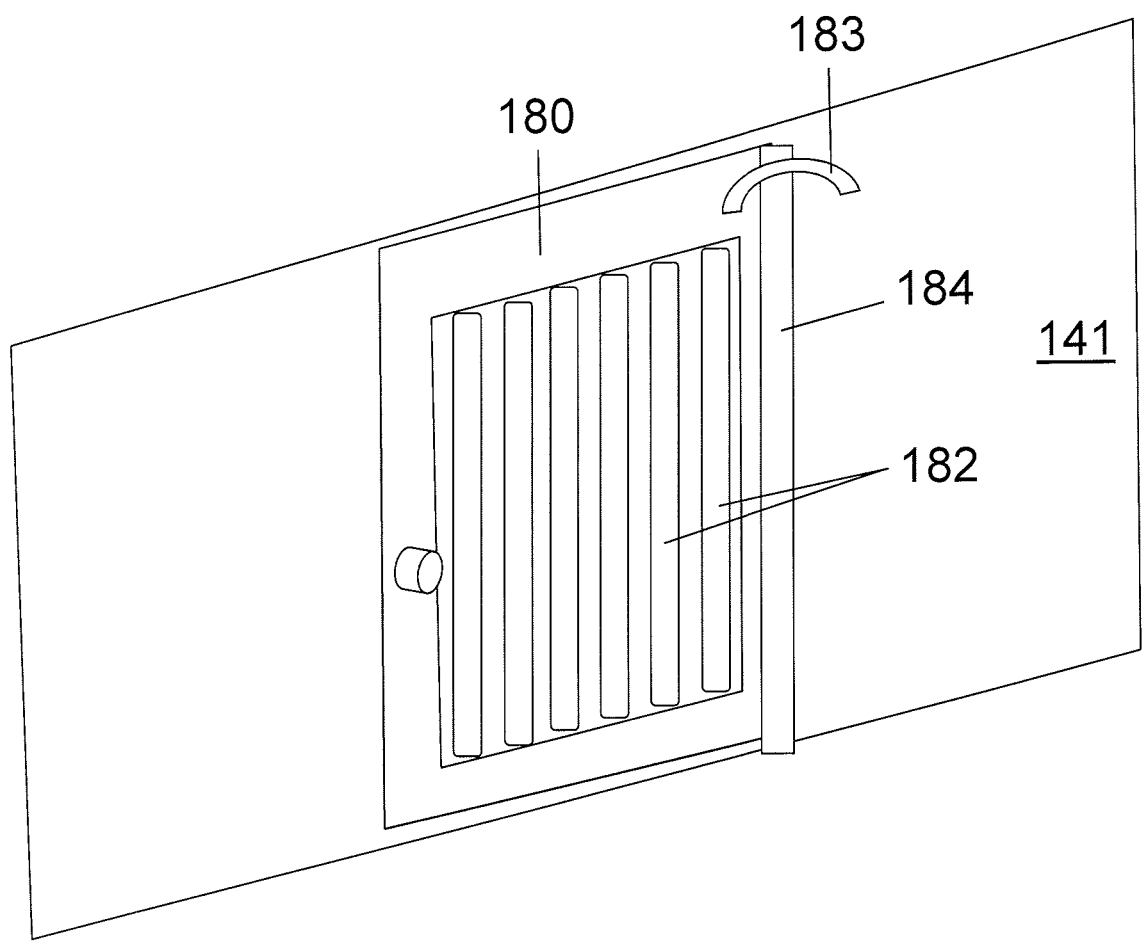
FIG. 4 shows a rack room door with variable air flow intake according to a second embodiment of the invention.

As shown by FIG. 4, each cooling air intake grille 142 is part of a securable door 180 that can be opened and closed to allow personnel access from the air supply corridor 123 to the cold aisle 144 of the rack room 140. Each cooling air intake grille door 180 is made from aluminium and/or steel. Each door 180 opens by way of a hinge 184. Each set of dampers 182 is connected to the rack room control panel for its aisle by wiring which runs through a flexible tube 183.

On the front wall of the rack room 140, which is also the front external wall of the building, is a hot air outlet grille 146. The grille 146 is divided into four equally sized sections. Each of these sections has a damper that is individually controllable by the air optimiser control panel 137 so that the amount of hot air 16 that is exhausted from the building 100 through hot air outlet grill 146 can be controlled.

The ambient air intake grille 113 is also divided into four equally sized sections, each of which has its own individually controllable damper controlled by the air optimiser control panel 137. The air optimiser control panel is programmed such that the dampers in the air intake grille 113 and the dampers in the exhaust grilles 146 move in tandem and are always in the same position.

The air optimiser control panel 137 is programmed to open and shut the air intake and exhaust dampers in such a way that the finest possible degree of control over the amount of air exiting and entering the data centre is achieved. This means that, for example, if the ambient air intake dampers and the exhaust dampers are required to be 25% open, for each grille one of the four sections will be fully open and the other three will be fully closed. If the cooling load increases from this situation so that more airflow is needed, a second section will start to open until the demand for cooling air is met. If the cooling load increases further, the second section will open more. If it reaches the fully open and the demand is still not met, a third section will start to open, and so on.

The air optimiser control panel 137 is programmed so that it instructs the sections to open in a different order each week, cycling through all possible orders. This evens out the wear on the actuators that move the dampers. The air optimiser control panel 137 uses PI controllers to control the air intake and exhaust dampers.

In use, the data centre building 100 of FIG. 3 operates to cool the racks 143 in the rack room 140 by generating a sufficient quantity, velocity and pressure of cooling air 18a in the air optimisation unit 122. The operation of the air optimisation unit will now be described in detail, with reference to FIG. 7.

When the data centre is started up for the first time, the air optimisation unit 122 must be turned on by activating a switch. This causes the fans 700 to begin operating at a preset speed, without activating any of the other air optimisation equipment. The fans 700 operate at this preset speed for a preset time period of two minutes. During this period the air pressure across the fans is measured by pressure sensors upstream and downstream of the fans, and monitored by the air optimiser control panel 137. If at the end of the two minute period the pressure differential is greater or equal to 5 Pa, and has been for at least 15 seconds, the rest of the air optimisation equipment is activated and normal control as described below is established. If the pressure differential condition is not met, then the rest of the air optimisation equipment is not allowed to begin operation. Once normal operation is established, the air optimisation unit functions as follows.

Air entering the air optimisation unit may be ambient air 18, which enters through ambient air intake grille 121, exhaust air 16, which enters through return air intake grille 125, or a combination of ambient air 18 and exhaust air 16, depending on the positions of the ambient air intake damper and the return air intake damper (as explained above, the position of the exhaust air dampers is always the same as the position of the ambient air intake damper). The position of these dampers is controlled by the air optimiser control panel 137. The air optimiser control panel is connected to the outside ambient air temperature and relative humidity sensor $TH_O$, which is located outside the building 100, near the ambient air intake hole.

Figure 5:
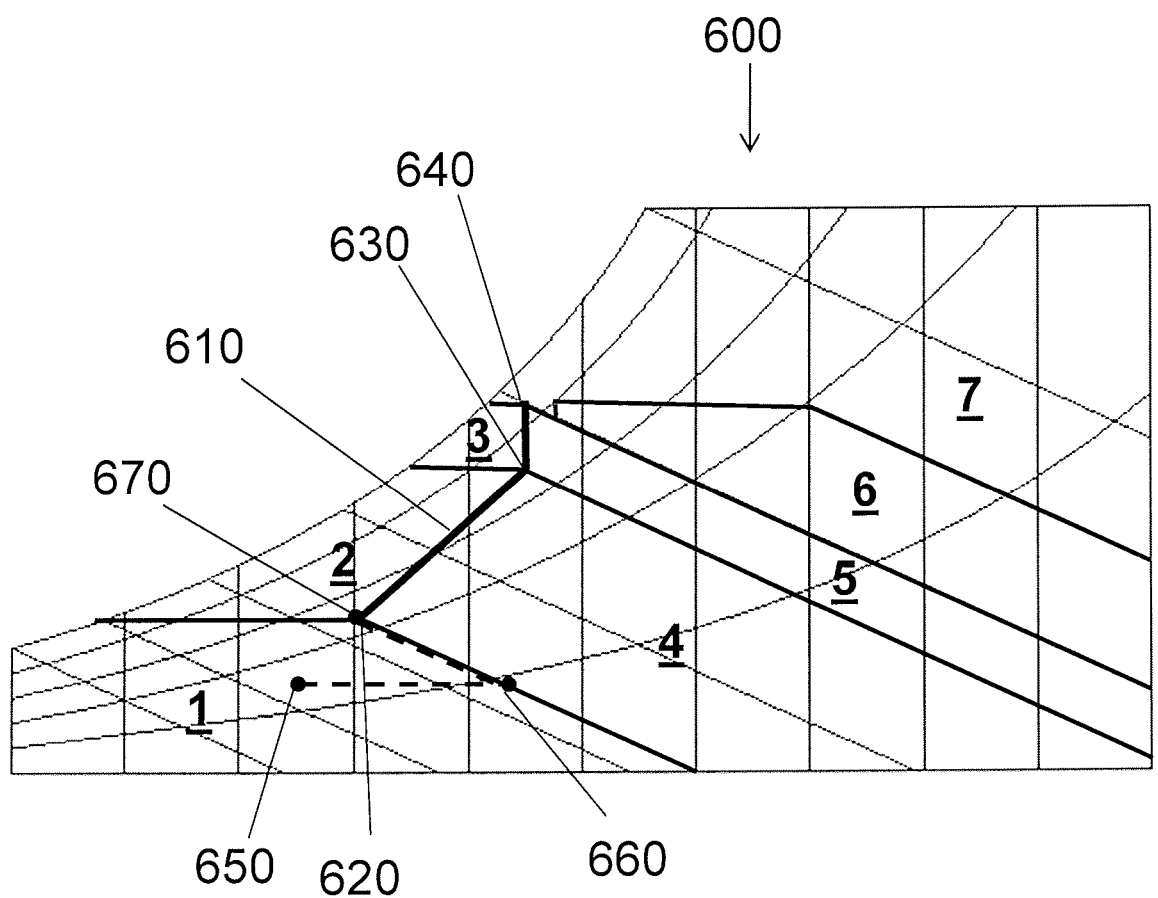
FIG. 5 shows a first example psychrometric chart including a control line and zones.

Sensor $TH_O$ measures the temperature and relative humidity of the ambient air outside the building. The air optimiser control panel 137 uses these measured values to determine which one of seven pre-defined zones on a psychrometric chart 600 the ambient air falls within. These zones are shown by FIG. 5. There are seven zones, referred to as zone 1, zone 2 and so on, up to zone 7. In FIG. 5, zone 1 represents a relatively cold and dry zone, whereas zone 7 represents a relatively hot and humid zone. Further explanation concerning these seven zones and their function is provided later on. Which zone the measured values fall within determines whether the ambient air intake damper and the return air intake damper are open or closed, and hence whether the supply air consists of just ambient air 18, just exhaust air 16, or a mixture of ambient air 18 and exhaust air 16. The exact position of each damper is controllable by the air optimiser control panel 137 using a PI controller.

If both the return air damper and the ambient air intake damper are open, ambient air 18 and exhaust air 16 are mixed together in mixing box 740 to create supply air.

From the mixing box, the supply air then passes through filters 710, which remove dust and other particles from the supply air. Once it has passed through the filters 710, the supply air passes through a DX cooling system 730, which comprises six DX cooling coils and six condenser units. The DX cooling system 730 is controlled by the air optimiser control panel 137 using a PI controller. Whether the DX cooling system is on or off, and if on, at what level it is operating, is determined by which zone the ambient air characteristics measured by sensor $TH_0$ fall within. The air optimiser control panel is programmed to only allow operation of the DX system 730 when there is positive airflow across the fans 700.

Once the supply air has passed through the DX cooling system 730 it passes through the adiabatic cooler 720 and/or the bypass damper 750. When the bypass damper 750 is closed all of the supply air will pass through the adiabatic cooler 720. When the bypass damper 750 is partially open, some of the supply air will pass through the adiabatic cooler 720 and some will pass through the bypass damper 750. If the adiabatic cooler is operating at the same level in both scenarios, the air downstream of the adiabatic cooler 720 will be colder and more humid if the bypass damper is shut than if it is open.

The adiabatic cooler 720 consists of a matrix made of corrugated sheets of glass fibre material. Water is supplied to the top of the matrix and flows down its corrugated surface. The supply air passes through air gaps between the sheets of moist material, picking up water vapour as it does so. This increases the relative humidity and lowers the temperature of the supply air. The water that does not evaporate flows into a stainless steel tank at the base of the unit before being re-circulated up on to the matrix again. The matrix has four sections, each of which has a separate water supply that is individually controlled by the air optimiser control panel. This allows the level of humidification and cooling provided by the adiabatic cooler to be varied between four different states. The amount of cooling can be further varied by altering how much air passes through the bypass damper and therefore is not cooled at all.

The amount of cooling done by the adiabatic cooler 720 is determined by which zone the temperature and relative humidity values measured by sensor $TH_0$ fall within. When the adiabatic cooler is on, the level at which it is operating at any given time is controlled in dependence on the temperature and relative humidity measured by sensor $TH_2$. (Like sensor $TH_0$, sensor $TH_2$ actually comprises two separate temperature and humidity sensors, and the temperarure and humidity values provided to the air optimiser control panel 137 are averages of the values measured by the two sensors.) When the adiabatic cooler 720 is completely off (for example when the ambient air is in zone 7) the bypass damper 750 is fully open. When the adiabatic cooler 720 is on, the level at which it operates and the exact position of the bypass damper 750 (which together determine the amount of cooling) are controlled by the air optimiser control panel 137 using a PI controller.

The bypass damper allows a much finer degree of control over the amount of cooling provided by the adiabatic cooler 720 than would be possible without such a damper. When the adiabatic cooler is on, which (if any) of the water supplies for the adiabatic cooler 720 are on, and the position of the bypass damper 750, at any given time is determined by the air optimiser control panel based on the temperature and relative humidity of the air immediately downstream of the adiabatic cooler as measured by sensor $TH_2$.

The control process for the adiabatic cooler 720 and the bypass damper 750 will now be described. When no adiabatic cooling is required, all four sections of the adiabatic cooler are off (i.e. no water is flowing through them) and the bypass damper 750 is fully open. If the cooling demand increases, one section of the adiabatic cooler is brought online using the following procedure, which is programmed in to the air optimiser control panel 137.

When a new section is about to be brought online, the bypass damper is always instructed to move to the fully closed position. When the bypass damper has been fully closed for 30 seconds, the new section is activated by turning on the water supply to that section. Once the water supply has been switched on, the bypass damper is moved to a pre-set position corresponding to approximately two-thirds open. Once this activation sequence has been completed, the amount of cooling is then adjusted to exactly meet the demand at any given time by adjusting the position of the damper. If the cooling demand increases to the point where it is not met even with the damper fully closed, an additional section of the adiabatic cooler must be brought online.

The air optimiser control panel is programmed such that there is always a delay of 30 seconds between the bypass damper 750 closing and an additional section of the adiabatic cooler 720 switching on. This is because the inactive sections of the cooler may still be wet from previous use, in which case more cooling than expected would result when the damper was fully closed. If the cooling demand is still not met after the 30 seconds has passed, a second section of the adiabatic cooler 720 is switched on and the damper is moved to the pre-set position. As cooling demand increases, this process will be repeated until all four sections of the adiabatic cooler are switched on and the bypass damper 750 is fully closed, at which point the adiabatic cooler 720 is providing its maximum amount of cooling.

As the cooling load decreases, the bypass damper 750 is opened. If the damper reaches the fully open position and there is still too much cooling being done, a section of the adiabatic cooler is switched off (by shutting off its water supply) and at the same time the bypass damper 750 is instructed to start closing. The bypass damper takes approximately 2.5 minutes to move from fully open to fully closed. A section of the cooler will become completely dry approximately 5-10 minutes after it has been switched off if there is airflow through it.

As the recently switched off section dries, the amount of cooling provided by the adiabatic cooler drops. The bypass damper is instructed to close to compensate for this drop. The bypass damper 750 will not usually reach the fully closed position, instead it will stop closing once the data from sensor $TH_2$ show that the amount of cooling being provided meets the cooling demand and hence the cooling air meets the pre-defined criteria for cooling air programmed into the memory of the air optimiser control panel 137.

If the cooling demand drops further, the bypass damper 750 will open. If it reaches fully open and the amount of cooling being done is still too high, another section of the cooler will be switched off using the process described above. The degree of control provided by the combination of the four-sectional adiabatic cooler 720 and the bypass damper 750 is such that the amount of adiabatic cooling being done can be tailored to closely match the cooling demand at any given time.

Once the supply air has passed through the adiabatic cooler 720 or the bypass damper 750, its relative humidity will meet pre-defined criteria for cooling air programmed into the memory of the air optimiser control panel 137 but its temperature will be approximately 1° C. too low to meet the pre-defined criteria for cooling air. This is because the temperature of the supply air increases by approximately 1° C. as it passes through the fans 700.

The temperature and relative humidity of the cooling air supplied to the IT equipment is measured by sensor $TH_2$. If the temperature measured by $TH_2$ deviates from the pre-defined criteria for cooling air by more than 5° C. then an alarm is raised.

The pre-defined criteria for cooling air are represented by a single control line 610 on psychrometric chart 600 (see FIG. 5), which in accordance with convention, has a horizontal axis measuring dry-bulb temperature and a vertical axis measuring moisture content. The user can select an appropriate control line based on the characteristics of the IT equipment installed in the data centre. In the current example the control line joins point 620 (representing a temperature of 18° C. and a relative relative humidity of 45%), point 630 (representing a temperature of 24° C. and a relative humidity of 65%) and point 640 (representing a temperature of 24° C. and a relative humidity of 80%). The cooling air supplied to the IT equipment may have temperature and relative humidity substantially equal to any point on this line. Each section of the control line 610 is defined by the equation of a straight line having terms for enthalpy, moisture content and dry bulb temperature.

The psychrometric chart 600 is divided into a plurality of different zones around the control line. The zones are bounded by the control line 610, lines of constant enthalpy, lines of constant temperature and/or lines of constant moisture content. The boundaries of the zones are calculated by the control process panel 137 when the user defines the control line that is to be used. In the current example the control line 610 has two straight line sections, which leads to seven zones. FIG. 6 shows an alternative control line 680 which has three straight line sections. The control line 680 in FIG. 6 results in nine separate zones, since zone 1 has been split into three separate zones 1a, 1b and 1c. The control line 680 of FIG. 6 has the effect of reducing the water consumption of the data centre as compared with control line 610 of FIG. 5, since it allows the supply air provided to the IT equipment to be less humid. The control line can be altered while the data centre is in operation, in which case the control process panel 137 will automatically recalculate the number, size and position of the zones.

The sensor THo measures the temperature and relative humidity of the ambient air 18, and the moisture content and enthalpy of the ambient air (hereafter "measured moisture content" and "measured enthalpy") are calculated from these values as measured. A processor in control process panel 137 uses the measured moisture content and measured enthalpy and/or the measured temperature and measured relative humidity to determine which zone the ambient air falls within. If the ambient air 18 falls within zones 1, 3, 5, 6 or 7 then the control process panel 137 can determine the zone by comparing the measured temperature, measured moisture content and/or measured enthalpy values with the constant values of temperature, moisture content and/or enthalpy that represent the zone boundaries. For example, if the measured temperature is greater than 24° C. and the measured enthalpy lies between the values represented by the upper and lower lines of constant enthalpy that bound zone 5, the outside air will have characteristics that fall within zone 5 (there will be no need for comparison of other values). If the ambient air 18 falls within zone 2 or zone 4, the control process panel 137 must additionally determine which side of the control line the ambient air 18 lies by substituting the measured temperature into the equation of the control line. If the resulting value for moisture content is greater than the measured moisture content then the ambient air is in zone 4. If the resulting value is less than the measured value, then the ambient air 18 is in zone 2.

The psychrome trie characteristics of humid air vary with air pressure. As such, the control process panel 137 is able to compensate (or recalibrate) to account for atmospheric air pressure. Whilst day-to-day variations need not be accounted for, the average atmospheric air pressure of ambient air at a given location, dictated for example by altitude, may usefully be taken into account. The control process panel 137 is pre-programmed with the altitude at which the data centre is located and thus adjusts its calculations accordingly.

Once it has been determined which zone the ambient air falls into, the processor in control process panel 137 calculates the most efficient way to adjust the temperature and relative humidity of the ambient air 18 (i.e. using the most amount of free cooling and/or the least amount of mechanical cooling possible) until it is somewhere on the control line 610, and selects a target point on the control line accordingly. Thus a target point (or set point) is calculated on the basis of the psychrometric characteristics of the outside air, such that the target point lies at a position on a control line so that the target point can be reached in an energy efficient manner.

Table 1 shows how the air optimisation unit 122 adjusts the temperature and relative humidity of the ambient air 18 to be on the control line depending on which zone the ambient air 18 falls into.

When the ambient air 18 is in zone 1, which will be a significant amount of the time in the UK, it will be adjusted so that its temperature and relative humidity are substantially equal to a point on the control line 610 by mixing it with exhaust air 16, adiabatically cooling the resulting supply air, and then passing it through fans 700. For example, for ambient air having temperature and relative humidity represented by point 650 on the psychrometric chart 600, the air optimiser control panel 137 calculates a first target temperature and relative humidity for the mixed supply air, this first target being represented by point 660 on chart 600. The first target point 660 is on the boundary line between zones 1 and 4, since this is the first line of constant enthalpy (the diagonal lines on the chart 600) to intersect the control line 610.

The air optimiser control panel 137 then modulates the position of the intake, exhaust and return dampers (the position of the intake and exhaust dampers is always the same), based on the temperature and relative humidity measured by a sensor THi located between the DX cooling coils 730 and the adiabatic cooler 720, until the values measured by sensor THi are equal to the first target values 660 for the mixed supply air. The air optimiser control panel also receives information about the temperature and relative humidity of the exhaust air 16 from sensor T¾, which is located near return air intake grille 125.

The temperature and relative humidity of air can be adjusted along the lines of constant enthalpy without any energy needing to be input into the system. The temperature and relative humidity of the mixed supply air can therefore be adjusted from point 660 to a point approximately 1° C. colder than the final target point 670 on the control line by adiabatic cooling (since this does not change the enthalpy of the air), which uses very little energy. Passing the air through fans 700 then raises its temperature by approximately 1° C., so its characteristics are then equal to the final target point 670.

The air optimiser control panel 137 modulates the level at which the adiabatic cooler 720 is operating and the position of the bypass damper 750, using PI controllers, until the values measured by sensor $TH_2$ are substantially equal to the final target values 670. Supply air 18a downstream of fans 700 therefore meets the pre-defined criteria for cooling air to be supplied to the IT equipment. The air optimiser control panel 137 is programmed to accept a greater tolerance in the relative humidity of the cooling air than in the temperature of the cooling air. For example if the relative humidity measured by sensor $TH_2$ is up to 10% higher or lower than the final target value represented by point 670, it will be deemed to be at this target value. On the other hand, the temperature measured by sensor $T_{H2}$ will be deemed to be at the final target value for cooling air if it is up to 0.5% higher or lower than the target value.

The same control principles apply when the ambient air is in the other zones, so these will be discussed more briefly.

When the ambient air 18 is in zone 2, it can be adjusted to a state where its temperature and relative humidity lie on the control line 610 purely by mixing with exhaust air 16, without any adiabatic cooling. The target value for temperature is calculated by substituting the measured moisture content of the ambient air 18 into the equation of the control line between points 670 and 630 and solving this equation to give the required temperature for the supply air (i.e. the cooling air that is supplied to the IT equipment to be cooled). The moisture content of the ambient air 18 and exhaust air 16 will usually be approximately the same when the ambient air is in zone 2, so the relative humidity is not changed by the mixing process. Whilst in theory the target temperature can be achieved solely by mixing exhaust and ambient air, in practice when the ambient air characteristics are very close to the boundary with zone 4, some adiabatic cooling is often required, and this is allowed by the programming of the control process panel 137.

When the temperature and relative humidity of the ambient air are such that it falls into zone 3, the ambient air 18 can be adjusted to a state where its temperature and relative humidity lie on the control line 610 purely by mixing with exhaust air 16. Where the control line bounds zone 3 it is a line of constant temperature, so there is no need for the control process panel 137 to calculate a target temperature (because the target temperature is that represented by the control line dividing zones 3 and 5). As with zone 2, the moisture content of the ambient air will be substantially unchanged.

When the temperature and relative humidity of the ambient air 18 are such that it falls into zone 4, the ambient air may be adjusted to a state where its temperature and relative humidity lie on the control line 610 purely through adiabatic cooling. The target value for temperature is calculated by substituting the measured enthalpy of the ambient air 18 into the equation of the control line between points 670 and 630 and solving this equation to give the required temperature for the supply air. The relative humidity of the supply air will be greater than the relative humidity of the ambient air as a consequence of using adiabatic cooling, which conserves the enthalpy of the air.

When the ambient air falls into zone 5, the ambient air can be adjusted to a state where its temperature and relative humidity lie on the control line 610 using just adiabatic cooling. Where the control line bounds zone 5 it is a line of constant temperature, so the control process panel 137 simply sets the target temperature at this constant temperature. As with zone 4, the relative humidity of the ambient air will be increased by the adiabatic cooling process.

When the ambient air is in zones 4 or 5 there is no advantage gained by mixing the ambient air 18 with exhaust air 16, so the air optimiser control panel 137 closes the return air damper and fully opens the ambient air intake damper (and the exhaust damper).

When the temperature and relative humidity of the ambient air are such that it falls into zone 6, there is also no advantage to mixing the ambient air 18 with exhaust air 16. In this situation the supply air, which consists entirely of ambient air 18, must be cooled using DX cooling coils 730 until its temperature and relative humidity are at a point on a line of constant enthalpy that intersects the control line 610 (i.e. a line of constant enthalpy that intersects the line at or near point 640). The DX cooling system 730 includes condensers as well as cooling coils, and can operate in either a pure cooling mode or in a combined cooling and dehumidification mode. Once the supply air is at such a point it is cooled adiabatically until its characteristics are substantially equal to point 640 on the control line 610 (taking into account the heating caused by the fans).

TABLE 1

Types of cooling according to zone

| Zone | Composition of supply air | DX cooling | Adiabatic cooler | Bypass damper | TH1 controls | $TH_2$ controls |
|---|---|---|---|---|---|---|
| 1 | Mixture | Off | On | Modulating | Intake and return damper positions | Adiabatic cooler and bypass damper |
| 2 | Mixture | Off | Off | Open | — | Intake and return damper positions |
| 3 | Mixture | Off | Off | Open | — | Intake and return damper positions |
| 4 | 100% ambient air | Off | On | Modulating | — | Adiabatic cooler and bypass damper |
| 5 | 100% ambient air | Off | On | Modulating | — | Adiabatic cooler and bypass damper |
| 6 | 100% ambient air | On | On | Modulating | Rate of DX cooling | Adiabatic cooler and bypass damper |
| 7 | 100% exhaust air | On | Off | Open | Rate of DX cooling | Rate of DX cooling |

When the temperature and relative humidity of the ambient air are such that it falls into zone 7, the conditions of the ambient air 18 are such that it requires more energy to adjust them to lie on control line 610 than the amount of energy required to adjust the characteristics of exhaust air 16 to lie on the control line. As such, the air optimiser control panel 137 instructs the data centre to operate in a full recirculation mode in which the ambient air intake damper and the exhaust damper are closed and the return air damper and the adiabatic cooler bypass damper 750 are fully open, meaning that the supply air consists entirely of exhaust air 16. In this situation the supply air must be adjusted so that its temperature and relative humidity are on the control line 610 (taking into account the heating caused by the fans) using only DX cooling and dehumidification.

When the characteristics of the ambient air 18 change such that it moves from one zone to another, the control process panel 137 determines which zone the air has passed from and which zone it has pased into and uses this information to determine what the air optimiser needs to do to ensure that the temperature and relative humidity of the supply air remain on the control line 610.

When the zone changes into zone 1 from zone 2 or zone 4, the control process panel performs a proportional calculation based on enthalpy. The enthalpy of the exhaust air 16, the enthalpy of the ambient air 18 and the enthalpy of the required set point (point 620) are used to calculate the proportions of exhaust and ambient air that must be combined to achieve the set point enthalpy. This in turn determines the position of the intake, exhaust and return air dampers and the control process panel 137 moves the dampers to the positions so calculated and keeps them there for a pre-set period of three minutes. After this period has elapsed, the position of the dampers is once again allowed to vary along with the characteristics of the ambient air 18.

When the zone changes into zone 2 or zone 3 from any other zone, the control process panel 137 performs a proportional calculation based on temperature. The temperature of the exhaust air 16, the temperature of the ambient air 18, and the temperature of the required set point are used to calculate the proportions of exhaust and ambient air that must be combined to achieve the set point temperature. The positions of the intake, exhaust and return air dampers are adjusted accordingly and held in the calculated positions for three minutes.

When the zone changes into zones 4 to 7 there is no mixing of ambient and exhaust air so the damper positions do not need to be calculated.

The bank of variable speed fans 700 delivers cooling air 18a into the cold air corridor 123 at a rate determined by the air optimiser control panel 137 based on information on the air flow velocities measured by the velocity sensors 150, 160 and 170 and the position of the dampers in the cooling air intake grilles 142a, 142b and 142c communicated to it by each of the rack room control panels.

The speed at which the fans can operate is limited by a maximum speed calculated by the air optimiser control panel 137 every 10 seconds. This maximum speed is twice the speed necessary to deliver the theoretical maximum amount of cooling air required by the IT equipment installed in the data centre at a particular time, as calculated based on the actual power consumption of the IT equipment at that time. The air optimiser control panel 137 receives values for current power usage of the IT equipment at one minute intervals. In the event that one or more of the velocity sensors 150, 160 and 170 provides an artificially low reading to the air optimiser control panel 137, for example because baffles have been removed in a cold aisle for maintenance purposes, then the pre-set maximum fan speed prevents the variable speed fans 700 from operating at an unnecessarily high level. This consequently improves the energy efficiency of the data centre. However, during normal operation of the data centre the fan speed should always be significantly lower than this maximum limit.

The cooling air 18a is pushed out of the air optimisation unit 122 and moves above-floor along the air supply corridor 123. The dampers in the cooling air intake grille (s) 142 are controlled in combination with the speed of the variable speed fans 700 so as to ensure that exactly the right amount of cooling air 18a is supplied to each cold aisle 144 to meet the demand of the servers facing into that aisle at any given time. The cooling air 18a is drawn through the servers by their integral fans, and cools them as it goes through.

The resulting hot air 16 moves above-floor through the hot aisles 145 in the rack room 140 to the hot air corridor 132. The pressure differential between the cooling air 18a and the hot air 16 is maintained at a sufficient level to ensure there is no return of hot air 16 through the racks. This is done by monitoring the amount of air flowing through ducts 150, 160 and 170 using the air flow velocity sensors located in these ducts. The air flow velocity information for each cold aisle is fed to the rack room control panel for that aisle. The rack room control panel continuously passes this information to the air optimiser control panel 137 in the plant room 133, together with information about the position of the cooling air intake damper for the aisle in question.

The air optimiser control panel 137 and the rack room control panels are pre-programmed with a set point for the velocity of air flowing through ducts 150, 160 and 170. In the present example the set point is 0.35 m/s. If the velocity measured by any of the velocity sensors drops below this set point, the rack room control panel for the cold aisle supplying the duct in which that sensor is located will increase the amount of air being delivered to that aisle by opening the cooling air intake damper of that aisle further. If the damper reaches the fully open position and the airflow velocity measured by the sensor is still below the set point, the rack room control panel for that cold aisle will send a request to the air optimiser control panel 137 to increase the speed of the variable speed fans 700 until the velocity measured by the sensor is at the set point.

If this increase in the speed of the fans 700 causes the airflow velocity measured by any of the other sensors to rise above the set point, the rack room control panels for the aisles supplying the affected sensors will reduce the degree of openness of the cooling air intake dampers for those aisles until the airflow velocity measured by each sensor is at the set point. If the point is reached where one or more of the aisles has a fully closed damper and the air flow velocity measured by the sensor for that aisle is still measuring a velocity greater than the set point, the rack room control panel for the cold aisle supplying the duct in which that sensor is located will send a request to the air optimiser control panel 137 to reduce the speed of the variable speed fans 700 until the airflow velocity measured by that sensor is at the set point.

If at any time the airflow velocity measured by all of the velocity sensors is above the set point, the control process panel 137 will reduce the speed of the fans 700 until the airflow velocity measured by at least one of the sensors is at the set point.

The control system just described is designed so that the variable speed fans 700 are always operating at the minimum speed at which it is possible to meet the demand of the aisle having the largest cooling load at any given time. This significantly reduces the energy used by the data centre.

The air optimiser control panel 137 and the rack room control panels are all programmed with a watchdog routine to automatically monitor the health of the communications network linking the panels. Every 10 seconds, each of the rack room control panels sends a value of 100 to the air optimiser control panel 137, which returns a value of 0 to the rack room control panels 10 seconds later. This means that when the communications network is operating correctly, the values registered by each of the panels will oscillate between 100 and 0 every 10 seconds.

If a link between one of the rack room control panels and the air optimiser control panel is broken, that rack room control panel will register a constant value of 0 or 100. If the value does not change for 90 seconds the rack room control panel will go into a failsafe mode in which it fully opens the cooling air intake dampers for its aisle. If there is a fault with the rack room control panel itself, the cooling air intake dampers for that aisle are set up to move to a default position of fully open.

In this situation the air optimiser control panel will also register a constant value for the rack room control panel in question. If this value does not change for 90 seconds the air optimiser control panel will go into a fault mode in which the data centre operates in full recirculation mode using only the DX cooling system, with the fans 700 running at the calculated maximum speed limit based on the IT equipment power consumption and all of the cooling air intake dampers for the cold aisles fully open. In the fault mode the temperature of the supply air is controlled to a fixed pre-set temperature of 22° C. This fault mode ensures that sufficient cooling air is provided to all the servers if the air optimiser control panel is unable to determine the cooling load being experienced by one or more of the aisles because of a failure of the communications network or a fault with one or more of the rack room control panels. There is a backup air optimiser control panel which takes over in the case of a fault with the main air optimiser control panel. The data centre can only operate in the fault mode described above if it is being controlled by the backup air optimiser control panel.

In the event of the VESDA (Very Early Warning Smoke Detection Apparatus) system detecting smoke, as an initial step, the air optimisation control panel 137 causes air flow into and/or out of the building to cease by instructing the air optimisation control panel to close the dampers in the hot air outlet grille 146 and the ambient air intake grille 121. The building is therefore operating in full re-circulation mode, in which all of the cooling is done by the DX system 730.

If smoke is no longer detected then it is likely that any fire is outside the building and so there is no need to release the fire suppression gas. If, on the other hand, smoke is detected by two different types of smoke detector, it is likely that there is a fire within the building and fire suppression gas will be released.

As the fire suppression gas rapidly expands, release vents (not shown) in the building 100 are activated to maintain the building integrity.

When the building is in recirculation mode because the VESDA system has been activated, all of the cooling for the servers is provided by DX cooling coils 730. Since it is likely that the DX coils will have been off at the time of the alarm, as soon as the building goes into recirculation mode the air optimiser control panel 137 reduces the target temperature for the cooling air to 12° C. so that the cooling coils 730 will start up quickly. The air optimisation control panel 137 then increases the target temperature by 1° C. every minute until it reaches 22° C. This ensures that the temperature of the cooling air does not become too high whilst the building management system is adjusting to the new mode of operation.

If it turns out that the activation of the VESDA system was a false alarm, the air optimiser control panel 137 will switch the building from full re-circulation mode to the standard mode of operation based on the conditions of the ambient air. When the ambient air falls into zones 4, 5 and 6 this means that the building goes into a mode where it uses 100% ambient air for cooling. The ambient air may require a significant amount of adiabatic cooling in order to adjust its temperature and relative humidity to meet the criteria for cooling air. During the time the building was in re-circulation mode the adiabatic cooler 720 will have been offline and its matrix will have completely dried out. It takes approximately 10 minutes to bring the adiabatic cooler online to full capacity from this situation.

Clearly, if the switch from re-circulation mode into the normal control mode for zones 4, 5 or 6 was made without allowing for this, the adiabatic cooler would not at first be able to provide the amount of cooling required and the temperature of the supply air would become too high. To avoid this scenario, the air optimiser control panel is programmed to switch on the adiabatic cooler (all four sections if the ambient air is in zone 4 or 5, two sections if the ambient air is in zone 6) and operate at this fixed level for two minutes before the level of operation of the DX coils is reduced. This allows the matrix of the adiabatic cooler 720 to become sufficiently wet to cope with the cooling requirements of the ambient air. The level of operation of the adiabatic cooler is then fixed for a further minute before automatic control is restored.

As part of the procedure for returning to normal operation, a damper position calculation is carried out using the calculated supply temperature setpoint, outside air temperature and return air temperature to determine what position the exhaust, intake and return air dampers should be in to maintain the current calculated setpoint. If the ambient air is in zones 2 or 3, then the temperature based calculated damper position is used for 3 minutes with the dampers held at a position 5% lower than the actual calculated demand. The same procedure is used if the ambient air is in zone 1, but the damper position is calculated based on enthalpy instead of temperature. This offset encourages the automatic demand to wind up to the correct level so that after 3 minutes when the artificial signal is removed the dampers will automatically control to the right position.

The air optimiser control panel 137 will also switch the data centre into the full recirculation mode where all cooling is provided by the DX system 730 if it detects a fault with the adiabatic cooler 720. The same control processes for entering and leaving the full recirculation mode are used as described above.

In the event that, while the building is in full re-circulation mode because the VESDA system has detected smoke, but not an actual fire, two or more of the DX cooling coils 730 fail and the temperature of the cooling air measured by sensor $TH_2$ becomes too hot to meet the pre-defined criteria for cooling air, the air optimiser control panel 137 will switch the building into a mode where the cooling air comprises 100% ambient air to ensure that the cooling demand of the servers is met. If a fire inside the building is subsequently detected, the air optimiser control panel 137 will switch the building back into full re-circulation mode in spite of the failed DX coils, and will release the fire suppression gas. At this point it is more important to extinguish the fire than to meet the cooling demand of the servers.

Figure 9:
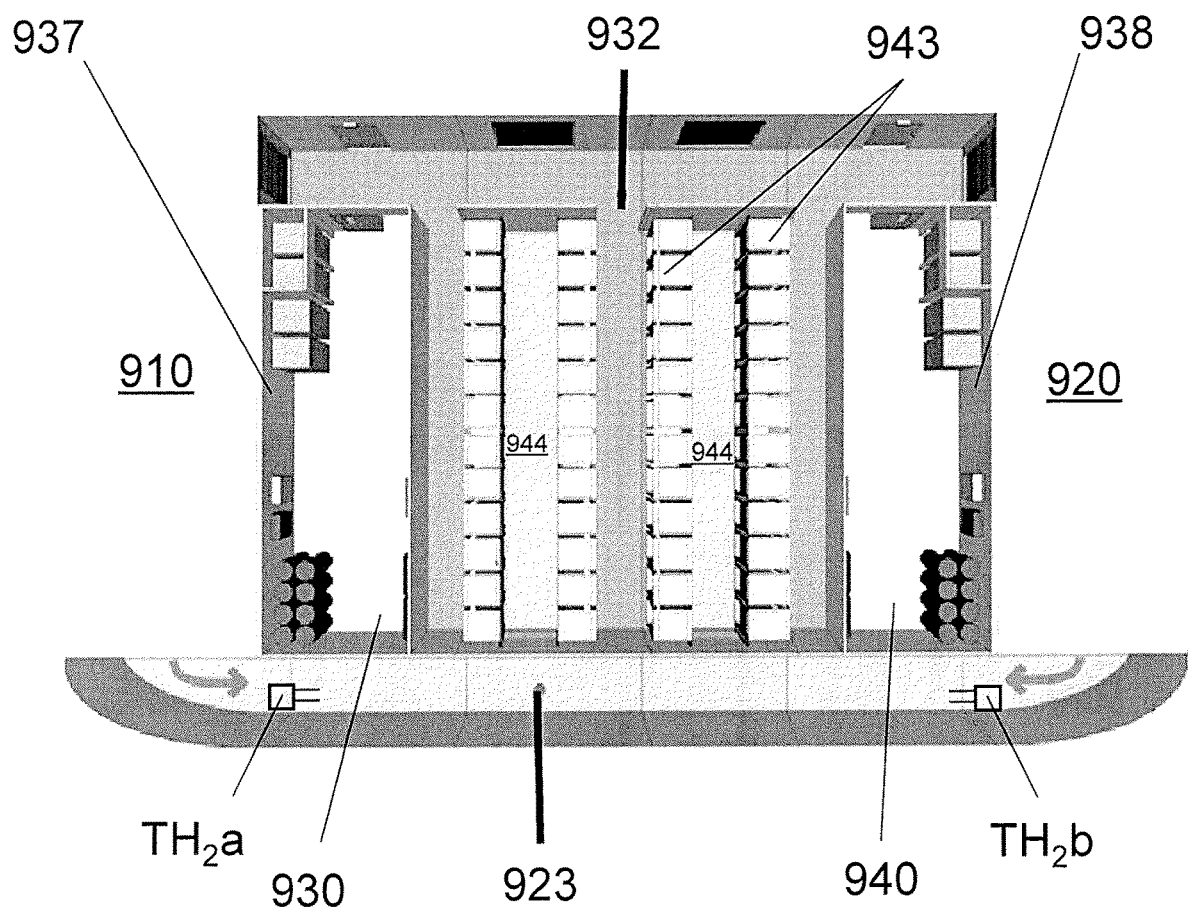
FIG. 9 is a partial plan view of a data centre according to a third embodiment of the invention.

FIG. 9 shows a data centre according to a third embodiment of the invention. This data centre is the same as the data centre of the second embodiment with an above-floor air supply corridor 923 and a hot air corridor 932; however, it has a second air optimisation unit 920 located at the opposite end of the rack room to the first air optimisation unit 910. The contents and operation of the second air optimisation unit 920 are identical to that of the first air optimisation unit 910, which are described above in relation to the second embodiment. There is also an additional plant room 940 between the second air optimisation unit 920 and the rack room.

Each air optimisation unit is controlled by its own dedicated air optimiser control panel. The first air optimiser control panel 937 is located in the first plant room 930 and the second air optimiser control panel 938 is located in the second plant room 940. Each control panel has its own backup control panel (not shown). Aspects of the operation of the data centre of the third embodiment which differ from the data centre of the second embodiment will now be described. Any aspects not mentioned may be assumed to be in accordance, mutatis mutandis, with the description provided above in relation to the second embodiment.

The two air optimiser control panels 937, 938 are connected via a communications link and each is programmed to recognise and monitor the presence and activity of the other. Each air optimiser control panel receives data from its own set of temperature and humidity sensors (only TH₂ a and b are shown) since the temperature and humidity conditions may be different between the two ends of the data centre. Each control panel 937, 938 therefore calculates a set point for the temperature and humidity of the cooling air independently, and may perform different cooling proceses to achieve the set points.

By contrast, both air optimiser control panels 937, 938 receive air flow velocity data from all of the velocity sensors in the rack room, and so cooling air is always supplied at the same rate from each air optimisation unit 910, 920 and both air optimiser control panels always send the same control signals to the aisle control panels (not shown) which control the degree of openness of the vents between the air supply corridor 923 and the cold aisles 944.

If one of the air optimiser control panels fails, its associated backup control panel will start up. The other air optimiser control panel will register the fault and will also hand over control to its backup control panel. This ensures that both air optimisation units 910, 920 are running in fault mode. Clearly if one unit was operating in fault mode (where all air is recirculated, a fixed set point is used and all the cooling is provided by the DX system) and the other unit was operating normally, the two units could end up operating in conflict with each other. Like the main air optimiser control panels, the backup panels are connected via a communications link and each is programmed to recognise and monitor the presence and activity of the other. The back up panels are programmed so that if one is activated, it instructs the other to activate as well.

If the adiabatic cooler in either of the air optimisation units 910, 920 fails, this will be registered by both air optimiser control panels 937, 938 and both of the air optimisation units will be switched into fault mode.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

It will be seen that in the above embodiments, the air is supplied to the cold region/cold aisle by means of an over-floor passageway, for example the personnel corridor (air supply corridor 123) from the source of cooling air (the air optimisation unit 122) to the rack room 140. As an alternative, the air supply corridor from the air optimisation unit 122 to the rack room 140 may be independent of the personnel passageway leading to the rack room module (s) 140. Instead of supplying air above the floor as in the illustrated embodiments, the air may be supplied at least partially via an under-floor duct.

Cooling air could be transported into the cold aisles through a wall of the rack room via one or more apertures or passageways in the wall that are not arranged to permit personnel access. There may be an access door to the rack room that is not part of the intended path for cooling air.

The ducts 150, 160 and 170 need not be located above the rows of racks, instead they may be located between adjacent racks, below the rows of racks, or within a rack or racks. The ducts may not have a hinged flap preventing air entering from the hot end, instead the velocity sensors in the ducts may be directional velocity sensors which provide information about the direction of the air flow.

There may be more than one duct connecting each cold aisle 144 to an adjacent hot aisle 145. In this case each duct would contain a velocity sensor that provides a velocity reading to the air optimiser control panel, but only the reading from one of the sensors would be used by the air optimiser control panel 137. The air optimiser control panel would use only the lowest of the two velocity readings. The other sensor would serve as a backup in case the first sensor failed.

The arrangement of the air optimisation unit 122 may be different from that described above. For example the DX cooling coils 730 may be downstream of the humidifier 720.

The control line 610 may be in the form of a closed loop or a point. The number and shape of the zones will vary according to the length and configuration of the control line.

Individual aspects of one embodiment may have application in other embodiments of the invention. For example, the use of a velocity sensor may have independent application of the method of controlling cooling air to meeting pre-set criteria. The treatment and/or cooling of the supply air to supply cooling air mentioned in the first embodiment need not therefore be effected in accordance with the method set out in the second embodiment. For example, the controlling of the temperature and humidity of the cooling air produced from the supply air may consist of ensuring that the cooling air is between relative wide acceptable limits of temperature and/or humidity.

The rack room control panels could instead use proportional-integral-derivative (PID) controllers to control the dampers 182. A PID controller uses three separate parameters which may be thought of as the reaction to the current error, the reaction to the accumulation of past errors, and the reaction based on a prediction of future errors. A weighted sum of these three parameters is used to determine the actual reaction, for example how the dampers 182 move in response to a change in the airflow velocity measured by the sensors. The PID algorithm used by the controller is tuned to provide optimal control of the dampers, such that the position quickly stabilises at the optimal value and does not oscillate around it for very long.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of cooling a data centre with an evaporative cooling apparatus, the evaporative cooling apparatus comprising an evaporative cooler having at least a first evaporative cooling section, a second evaporative cooling section and a third evaporative cooling section, wherein each section is individually selectively operable, and an adjustably sized aperture arranged as a bypass damper operable to allow air to bypass the sections of the cooler; the method comprising the following steps to control an amount of cooling,
   a) operating at least two but not all of the evaporative cooling sections, wherein air is permitted to pass through a non-operational section of the cooler;
   wherein the method further comprises either,
   increasing the amount of cooling by means of:
   b) reducing the size of the adjustable aperture, and
   c) causing a further single evaporative cooling section of the cooler to become operational and at substantially the same time increasing the size of the adjustable aperture by moving the adjustable aperture to a pre-set position,
   or,
   decreasing the amount of cooling by means of:
   d) increasing the size of the adjustable aperture, and
   e) causing a single evaporative cooling section of the cooler to become non-operational;
   wherein air is permitted to pass through said evaporative cooling section of the cooler caused to become non-operational.

2. The method according to claim 1, wherein the method comprises increasing the amount of cooling, and further includes repeating steps b) and c) so that a further evaporative cooling section becomes operational.

3. The method according to claim 1, wherein the method comprises decreasing the amount of cooling, and further includes repeating steps d) and e) so that a further evaporative cooling section becomes non-operational.

4. The method according to claim 1, wherein the method comprises increasing the amount of cooling, and wherein following step b) the aperture is held at a reduced size for a predetermined period of time before proceeding to step c), preferably the predetermined period of time is thirty seconds or longer.

5. The method according to claim 1, wherein the method comprises decreasing the amount of cooling, and wherein step d) is performed for a predetermined amount of time before proceeding to step e), preferably the predetermined amount of time is two and a half minutes or longer.

6. The method according to claim 1, wherein the method comprises increasing the amount of cooling, and wherein step c) is followed by a further step of reducing the size of the aperture until it is fully closed so that substantially all air passes through the evaporative cooling sections of the cooler.

7. The method according to claim 1, wherein the adjustably sized aperture is arranged in parallel with the cooler, preferably the adjustably sized aperture and the cooler are accommodated in the same airflow channel.

8. The method according to claim 1, wherein operation of a evaporative cooling section of the cooler includes introducing moisture into the evaporative cooling section, selectively of other evaporative cooling sections.

9. The method according to claim 1, wherein the evaporative cooling apparatus further comprises a control system configured to perform control processes in response to the cooling demand of the data centre and, wherein steps a) to e) are controlled by the control system in response to the cooling demand of the data centre, wherein the evaporative cooling apparatus comprises at least one temperature and/or humidity sensor and the method comprises operating the at least one temperature and/or humidity sensor to relay information about the cooling demand of the data centre to the control system.

10. The method according to claim 1, wherein the method comprises increasing the amount of cooling and wherein step d) includes opening the aperture completely.

11. An evaporative cooling apparatus configured for use as the evaporative cooling apparatus in the method of claim 1, the cooling apparatus comprising:
   an evaporative cooler having at least a first evaporative cooling section, a second evaporative cooling section and a third evaporative cooling section, wherein the first evaporative cooling section and second evaporative cooling section are individually selectively operable, each of the evaporative cooling sections being configured to cool air passing over or through the section; said cooling apparatus being arranged so that, in use, air is permitted to pass through a non-operating section of the cooler, and
   an adjustably sized aperture arranged as a bypass damper operable to permit air to bypass the sections of the cooler,
   wherein the amount of cooling provided by the apparatus depends on both how many evaporative cooling sections of the cooler are in operation and the size of the adjustably sized aperture.

12. The evaporative cooling apparatus according to claim 11, wherein all evaporative cooling sections of the cooler apparatus are arranged in parallel.

13. The evaporative cooling apparatus according to claim 11, wherein the adjustably sized aperture is arranged in parallel with the cooler, preferably the adjustably sized aperture and the cooler are accommodated in the same airflow channel.

14. The evaporative cooling apparatus according to claim 11, wherein each section of the cooler comprises a matrix made of corrugated sheets of glass fibre material, and in operation the matrix is configured so that water is supplied to the top of the matrix so that the water flows down the corrugated surface, wherein each of the matrixes has a separate water supply that is individually controlled.

15. The evaporative cooling apparatus according to claim 11, wherein the evaporative cooling apparatus further comprises a tank which is configured so that in use the tank collects water at the bottom of each matrix, the evaporative cooling apparatus is further configured to re-circulate at least some of the collected water back to the top of the matrix in use.

16. The evaporative cooling apparatus according to claim 11, wherein the evaporative cooling apparatus further comprises a control system configured to perform control processes in response to the cooling demand of the data centre and, wherein steps a), b) and c) are controlled by the control system in response to the cooling demand of the data centre.

17. The evaporative cooling apparatus according to claim 11, wherein the evaporative cooling apparatus further comprises a sensor which relays information about the cooling demand of the data centre to the control system.

18. The evaporative cooling apparatus according to claim 17, wherein the sensor is a humidity sensor and/or a temperature sensor.

19. The method of claim 1, wherein the evaporative cooler is an adiabatic cooler, and wherein the step of operating at least two but not all of the evaporative cooling sections of the cooler comprises operating the evaporative cooling sections to adiabatically cool air in the data centre.

20. The apparatus of claim 11, wherein the evaporative cooler is an adiabatic cooler, and wherein the evaporative cooling sections of the cooler are operable to adiabatically cool air in the data centre.

* * * * *